(12) United States Patent
Stanvick

(10) Patent No.: US 7,002,191 B2
(45) Date of Patent: Feb. 21, 2006

(54) SINGLE LAYER CONFIGURABLE LOGIC

(75) Inventor: Mark Stanvick, Portsmouth, NH (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/746,848

(22) Filed: Dec. 26, 2003
(Under 37 CFR 1.47)

(65) Prior Publication Data

US 2005/0146020 A1 Jul. 7, 2005

(51) Int. Cl.
*H01L 27/10* (2006.01)

(52) U.S. Cl. .......................... 257/202; 257/758; 716/10

(58) Field of Classification Search ................ 257/758, 257/202, 203–204, 207, 211, E27.108
See application file for complete search history.

(56) References Cited

U.S. PATENT DOCUMENTS

| | | | |
|---|---|---|---|
| 5,343,058 A * | 8/1994 | Shiffer, II | 257/204 |
| 5,665,989 A | 9/1997 | Dangelo | 257/210 |
| 5,777,383 A | 7/1998 | Stager et al. | 257/700 |
| 6,133,582 A * | 10/2000 | Osann et al. | 257/48 |
| 6,182,271 B1 * | 1/2001 | Yahagi | 716/10 |
| 6,242,767 B1 * | 6/2001 | How et al. | 257/202 |
| 6,492,253 B1 | 12/2002 | Chia et al. | 438/613 |
| 6,613,611 B1 * | 9/2003 | How et al. | 438/130 |
| 6,770,949 B1 * | 8/2004 | Eltoukhy | 257/536 |
| 2003/0155587 A1 * | 8/2003 | Smith et al. | 257/202 |
| 2004/0034843 A1 * | 2/2004 | Osann | 716/16 |
| 2004/0143797 A1 * | 7/2004 | Nguyen et al. | 716/1 |
| 2004/0232448 A1 * | 11/2004 | Yu et al. | 257/203 |

* cited by examiner

*Primary Examiner*—Long Pham
*Assistant Examiner*—Thao X. Le
(74) *Attorney, Agent, or Firm*—Christopher P. Maiorana, P.C.

(57) ABSTRACT

A semiconductor comprising a plurality of first building blocks arranged in one or more first rows and a plurality of second building blocks arranged in one or more second rows. The one or more second rows are interleaved with the one or more first rows and the first building blocks and the second building blocks each provide a segment of horizontal and a segment of vertical routing.

19 Claims, 23 Drawing Sheets

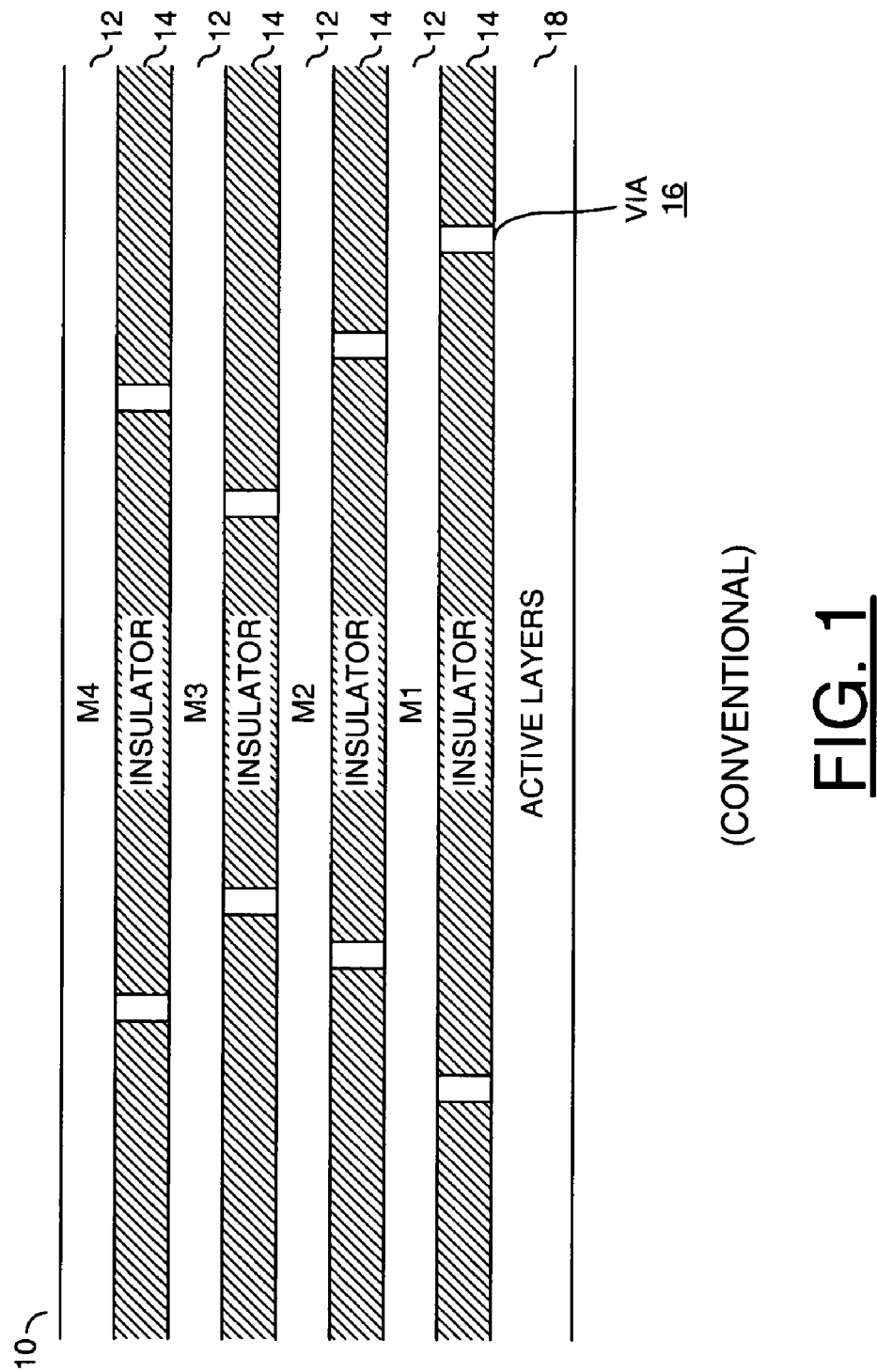
FIG. 1 (CONVENTIONAL)

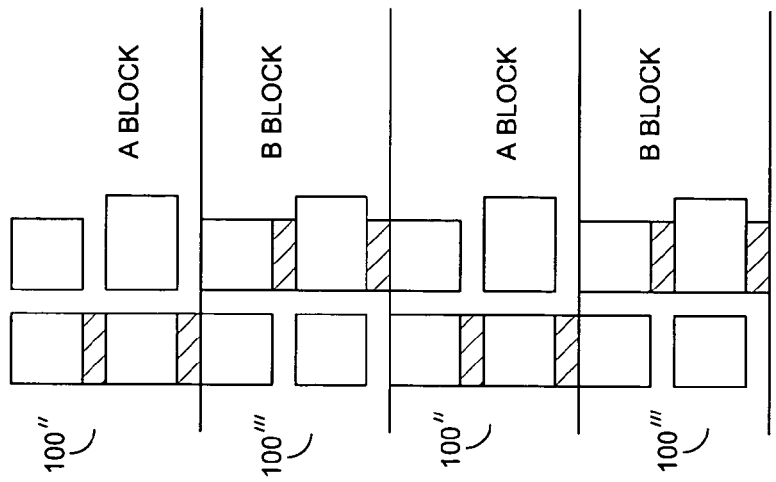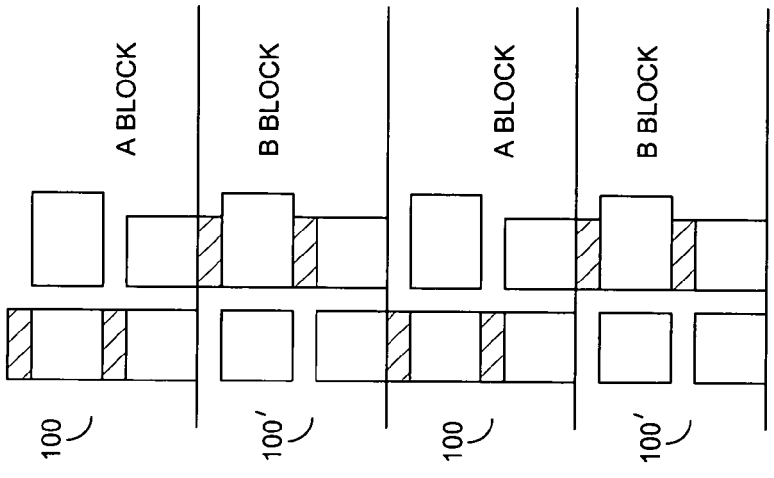
FIG. 8

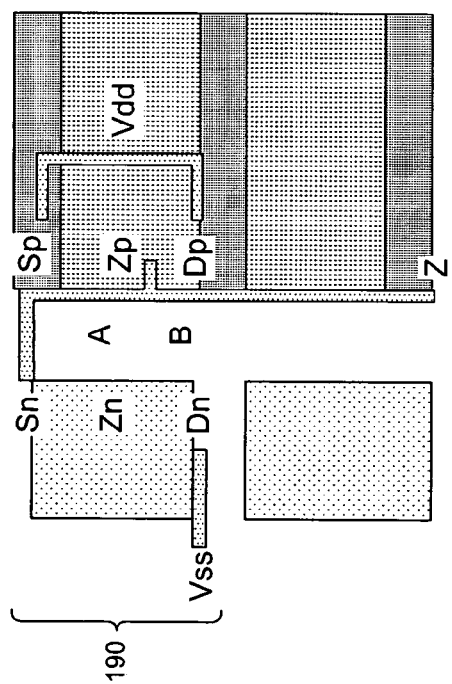
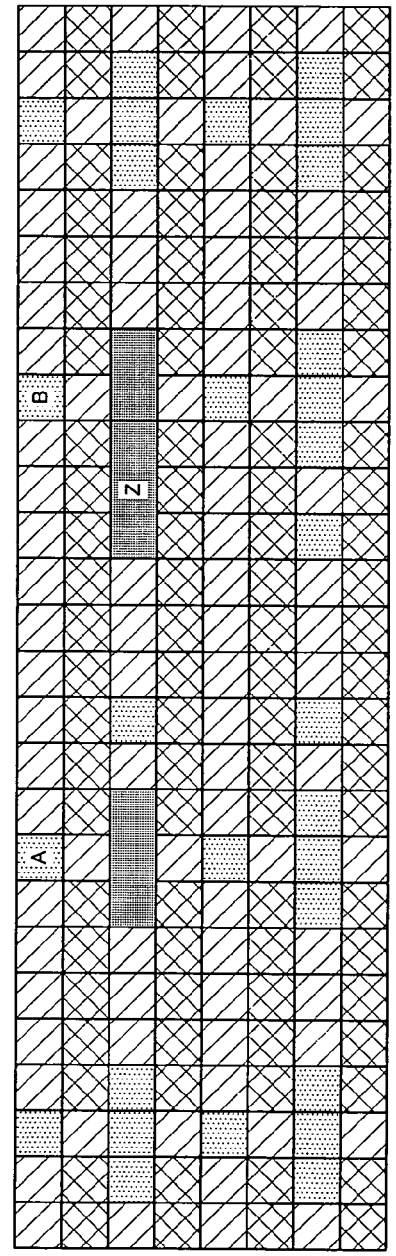
FIG. 19

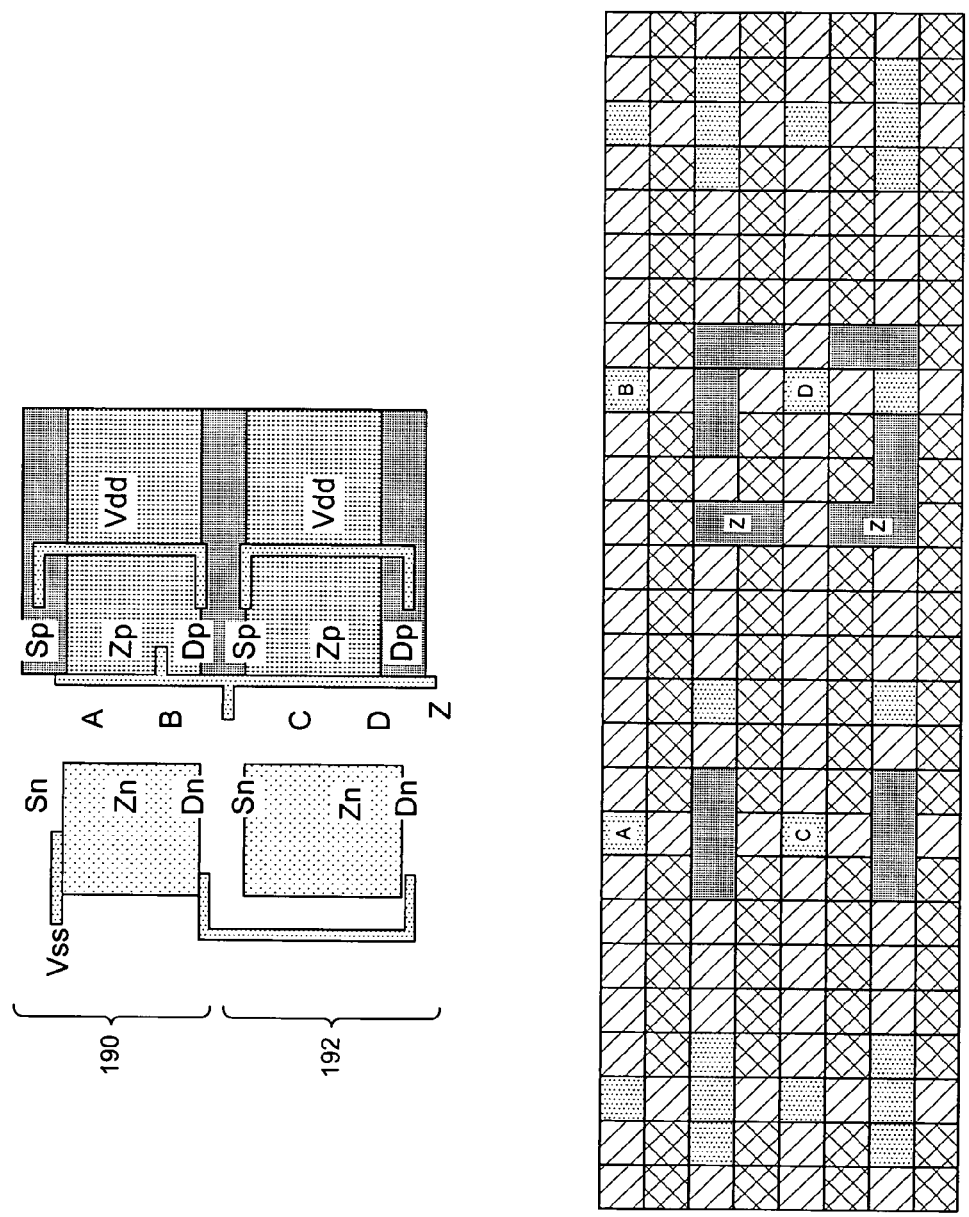

SINGLE LAYER CONFIGURABLE LOGIC

FIELD OF THE INVENTION

The present invention relates to programmable logic generally and, more particularly, to a method and/or apparatus for single layer configurable logic.

BACKGROUND OF THE INVENTION

Referring to FIG. 1, a block diagram of a semiconductor 10 is shown. The semiconductor 10 has a number of metal layers 12 (i.e., M1–M4) that are used for routing wires of the semiconductor. Each of the metal layers 12 is separated by an insulator layer 14. In a conventional process for "metalization" or routing in semiconductors, each metal layer 12 contains wires that run mostly in one direction (i.e., horizontal) or another (i.e., vertical). Conventional routing keeps wires in a single layer as long as possible. By using vias 16, wires in conventional routing can change layers (i) to avoid another wire, (ii) to change direction or (iii) to attach to a structure (e.g., a transistor) in an active layer 18.

In conventional routing, the top layer mostly consists of wires of that layer going in one direction. All of the wires in all of the layers beneath the top layer are buried. Thus, the wires beneath the top layer are completely inaccessible for programming from the top.

A solution that allows programming each wire in a semiconductor at the top layer would be desirable.

SUMMARY OF THE INVENTION

The present invention concerns a semiconductor comprising a plurality of first building blocks arranged in one or more first rows and a plurality of second building blocks arranged in one or more second rows. The one or more second rows are interleaved with the one or more first rows and the first building blocks and the second building blocks each provide a segment of horizontal and a segment of vertical routing.

The objects, features and advantages of the present invention include providing a method and/or apparatus for single layer configurable logic that may (i) maximize horizontal and vertical routing density, (ii) maximize density of lower layer contacts, (iii) provide efficient connection to routing, (iv) maximize flexibility in route direction, (v) minimize impossible and/or awkward turns, intersections, crossings, etc., (vi) provide single-layer configurability, (vii) provide single mask layer programmability, (viii) allow direct e-beam write and/or (ix) allow use of fuse/anti-fuse technology.

BRIEF DESCRIPTION OF THE DRAWINGS

These and other objects, features and advantages of the present invention will be apparent from the following detailed description and the appended claims and drawings in which:

FIG. 1 is a diagram illustrating wiring layers of a semiconductor;

FIG. 8 is block diagram illustrating stacking blocks to form columns;

FIG. 19 is a diagram illustrating an example 2-input NAND gate implemented using a single mask layer over an R-cell; and FIG. 20 is a diagram illustrating an example 4-input NAND gate implemented in a single mask layer over an R-cell.

DETAILED DESCRIPTION OF THE PREFERRED EMBODIMENTS

Figure 2A:
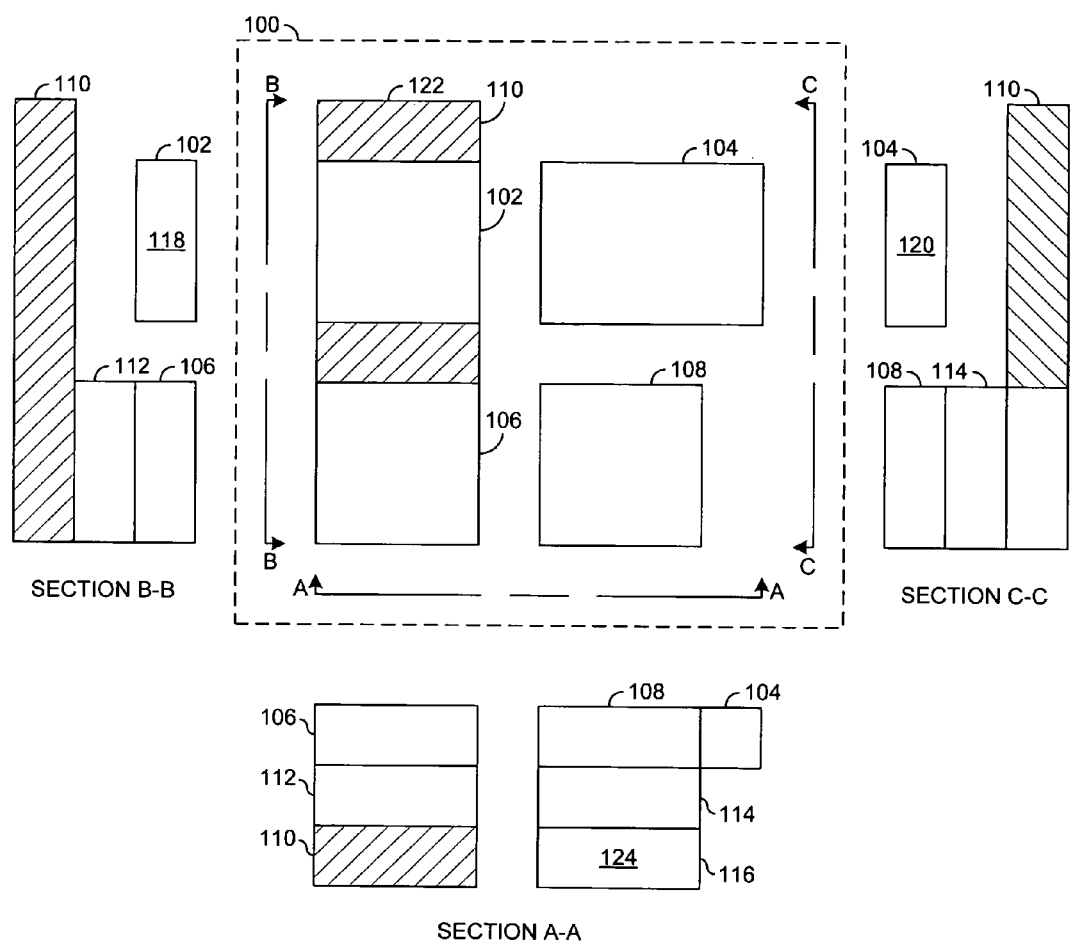
FIGS. 2(a–b) are diagrams illustrating various views of a set of array building blocks in accordance with a preferred embodiment of the present invention.

The present invention generally provides for programming (e.g., configuring, connecting, customizing, etc.) all or many of the metal interconnects that personalize a semiconductor device using the top layer of the device. Customization of a device via the top layer is advantageous because the top layer is generally accessible after the rest of the device (or chip) is built. For example, the top layer may be written on directly via a scanning electron microscope (SEM) or etched, for example, by laser (or other method). Alternatively, the top layer may be programmable like a programmable read only memory (PROM) or an erasable programmable read only memory (e.g., an EPROM erasable with UV light). In one example, the semiconductor device may be implemented having five layers. However, more or fewer layers may be implemented accordingly to meet the design criteria of a particular application. In general, the present invention may be implemented independently of the number of layers used.

The present invention generally provides a routing architecture that may be described by analogy to a fabric. For example, in a simple woven fabric, threads going both horizontally and vertically are generally visible on the surface of the fabric because they weave under and over each other. A similar structure may be implemented for the layers of metal in a semiconductor. Similarly to fabric, the number of metal layers that may be woven is not restricted to just two layers. Three or more layers may be woven together in such a way that all the wires of all the layers come up to the top layer periodically (e.g., similar to a multi-colored brocade fabric). Since all the wires come up to the top layer periodically, all of the wires are generally accessible after the semiconductor is manufactured. For clarity, the present invention is described using only two woven layers. However, the present invention may be applied to other numbers of layers based on the teaching herein.

Continuing the analogy, removing the top layer of the multi-layered brocade wire fabric (e.g., similar to cutting the loops in a pile rug) produces an open circuit at every place where a wire comes up to the top layer. By connecting cut wires back together or connecting one cut wire to a neighboring, different cut wire, the semiconductor device may be programmed or customized. In general, the present invention provides an architecture where each wire in a device weaves up and down through the layers of the devices such that each wire is available in the top layer for programming (e.g., "cutting" or removing the top layer is not actually necessary but was described to more clearly illustrate the concept of the present invention). The present invention generally provides for single layer configurability of a semiconductor by (i) a single mask layer, (ii) a direct electron beam write and/or (iii) application of fuse/anti-fuse technology. In one example, a semiconductor device (e.g., die, wafer, chip, etc.) may be fabricated with an array of 2×2 blocks forming the top layers. The semiconductor may be set aside (e.g., stored, placed in inventory, etc.) for subsequent customization (metalization, programming, personalization, configuration, etc.). In a subsequent fabrication step, the semiconductor may be configured, in one example, by place a single layer of straps on the top surface of the prefabricated device. The customization may be performed at the same time as the fabrication of the semiconductor or at a later time (e.g., days, weeks, months, etc.).

Figure 2B:
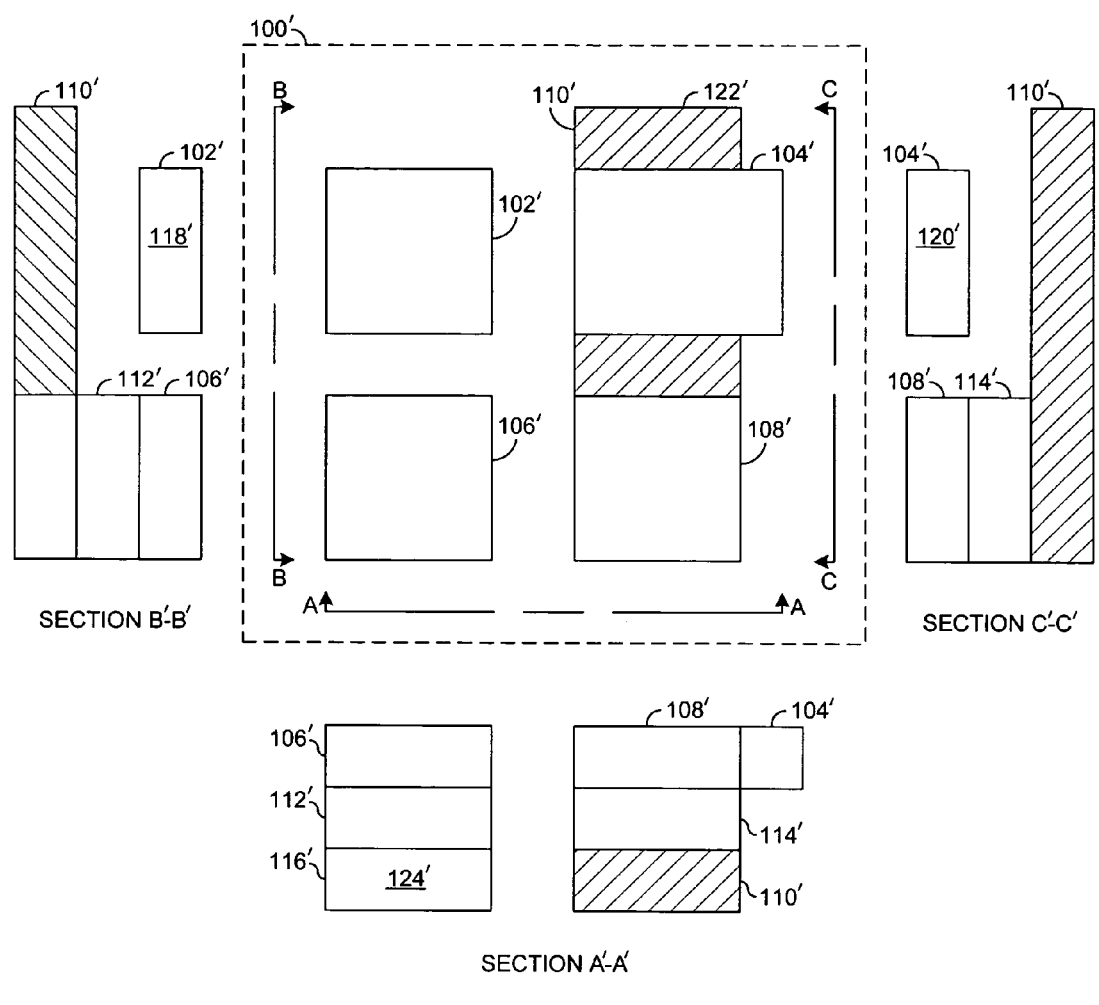

Referring to FIGS. 2(a–b), block diagrams are shown illustrating various views of example metal features (or array building blocks) in accordance with a preferred embodiment of the present invention. The present invention generally provides an underlying array architecture built upon 2×2 blocks. In a preferred embodiment, two types of 2×2 blocks are generally implemented. The two types are generally referred to as an A block (FIG. 2a) and a B block (FIG. 2b). As used herein, a block is generally defined as the smallest metal feature of a semiconductor device implemented in accordance with the present invention. Each of the A and B blocks generally provides two programmable routes (e.g., both a horizontal route and a vertical route). In one example, the A and B blocks may be implemented with a horizontal over vertical (H over V) configuration (e.g., FIGS. 2(a–b)). Alternatively, the A and B blocks may be implemented with a vertical over horizontal (V over H) configuration (e.g., FIGS. 3(a–b)). The blocks may be implemented with or without connection to lower layers (e.g., active layers, metal layers, etc.) of the semiconductor (described in more detail in connection with FIG. 7). The blocks generally provide a number of permutations for programming unique route topologies via placement of metal straps (described in more detail in connection with FIGS. 6(b–c) and 11–14) on the top layer of a semiconductor device implemented in accordance with the teachings of the present invention.

As used herein, horizontal generally refers to metal lines running in a first direction such that all horizontal lines are generally parallel to one another. Vertical generally refers to metal lines that run in a second direction that is substantially perpendicular to the first (horizontal) direction. Horizontal and vertical generally refer to relative orientations of wire with respect to one another. Horizontal and vertical lines are generally formed in metal layers that are parallel to an active layer of the semiconductor device. Horizontal and vertical generally do not refer to lines that are vertical to the active layer (e.g., vias).

Referring to FIG. 2a, a block diagram is shown illustrating an A block 100 with horizontal over vertical configuration. The block 100 generally comprises a number of layers. In one example, the block 100 may be implemented with three layers. The block 100 generally comprises a number of metal portions arranged in the three layers. In one example, the block 100 comprises a metal portion 102, a metal portion 104, a metal portion 106, a metal portion 108, a metal portion 110, a metal portion 112, a metal portion 114, and a metal portion 116. While the block 100 is described as having a number of separate metal portions, one skilled in the art would understand that the various metal portions may be combined in a single metal structure. For example, the metal portions 106, 110 and 112 are generally connected together to form a single element or feature. Similarly, the metal portions 108, 114 and 116 are stacked together to form another element or feature.

Figure 6A:
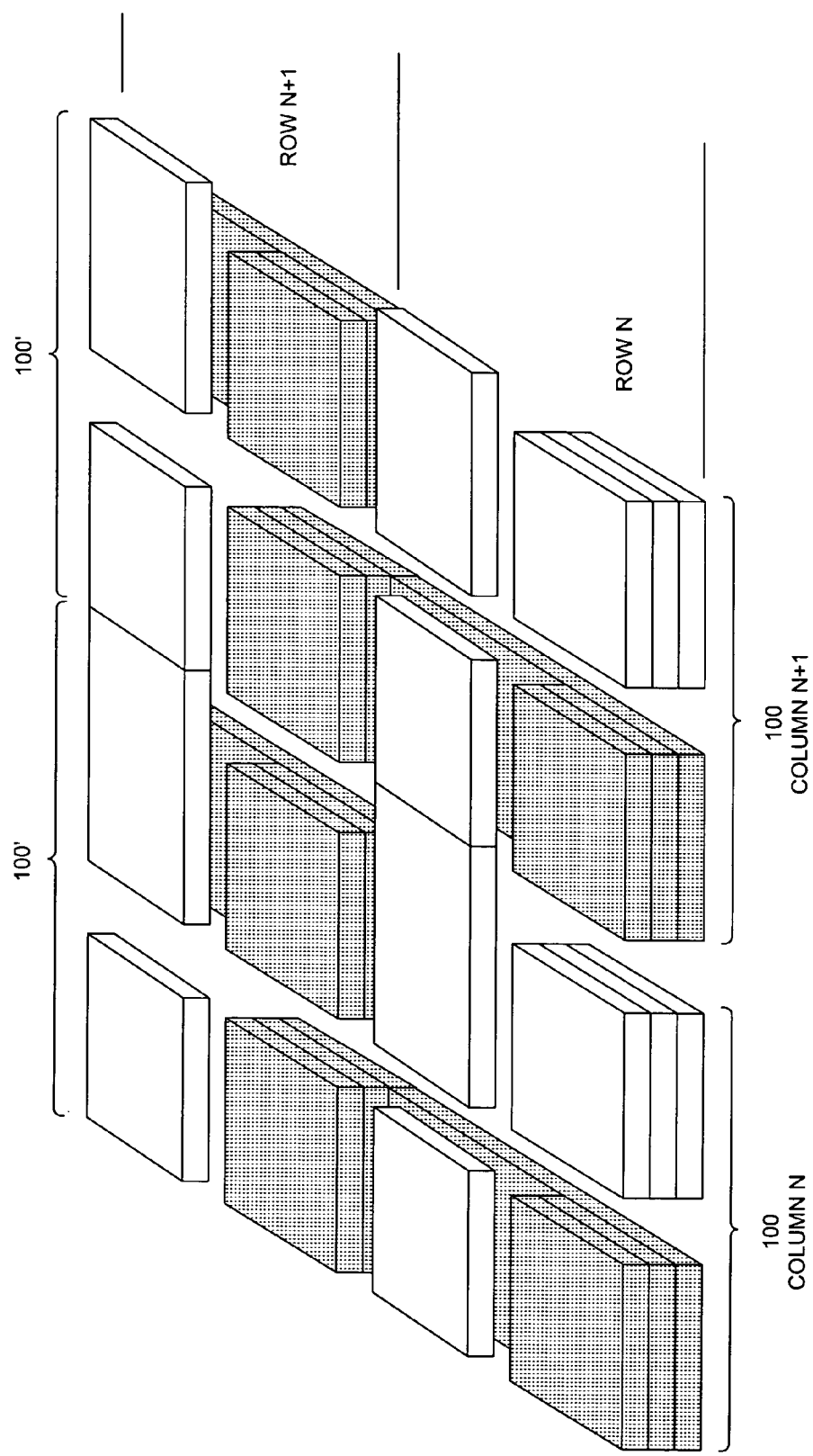
FIGS. 6(a–c) are orthogonal diagrams illustrating A and B blocks arrayed to facilitate programming of vertical and horizontal routes.

Each of the metal portions 102, 104, 110 and 116 may be configured to be connected the block 100 to other blocks. For example, the portion 102 generally has a surface (edge) 118 that may connect the block 100 horizontally to a second A block in a row. The portion 104 generally has a surface (or edge) 120 that may connect the block 100 horizontally to a third A block in the row. The portion 110 generally has a surface (or edge) 122 that may connect the block 100 vertically to a B block in a column. The portion 116 may have a surface (or edge) 124 that may connect the block 100 vertically to a second B block in the column. The interconnection of A and B blocks is illustrated in FIG. 6a. and 11–14.

Various views (e.g., Sections A—A, B—B and C—C) are shown to more clearly illustrate the three-dimensional relationship of the metal portions of the block 100. The block 100 generally further comprises insulating portions which have been omitted for clarity. However, one of ordinary skill in the art would understand how and where to incorporate the insulating portions based on the positions of the metal portions 102–116.

Referring to FIG. 2b, a block diagram is shown illustrating a B block 100' with horizontal over vertical configuration. The block 100' generally comprises a number of layers. In one example, the block 100' may be implemented with three layers. The block 100' generally comprises a number of metal portions arranged in the three layers. In one example, the block 100' comprises a metal portion 102', a metal portion 104', a metal portion 106', a metal portion 108', a metal portion 110', a metal portion 112', a metal portion 114', and a metal portion 116'. While the block 100' is described as having a number of separate metal portions, one skilled in the art would understand that the various metal portions may be combined in a single metal structure. For example, the metal portions 106', 112' and 116' are generally connected together to form a single element or feature. Similarly, the metal portions 108', 110' and 114' are stacked together to form another element or feature.

Each of the metal portions 102', 104', 110' and 116' may be configured to connect the block 100' to other blocks. For example, the portion 102' generally has a surface (edge) 118' that may connect the block 100' horizontally to a second B block in a row. The portion 104' generally has a surface (or edge) 120' that may connect the block 100' horizontally to a third B block in the row. The portion 110' generally has a surface (or edge) 122' that may connect the block 100' vertically to an A block in a column. The portion 116' may have a surface (or edge) 124' that may connect the block 100' vertically to a second A block in the column. The interconnection of A and B blocks is generally illustrated in FIGS. 6a. and 11–14.

Various views (e.g., Sections A'—A', B'—B' and C'—C') are shown to more clearly illustrate the three-dimensional relationship of the metal portions of the block 100'. The block 100' generally further comprises insulating portions which have been omitted for clarity. However, one of ordinary skill in the art would understand how and where to incorporate the insulating portions based on the position of the metal portions 102'–116'.

Figure 3A:
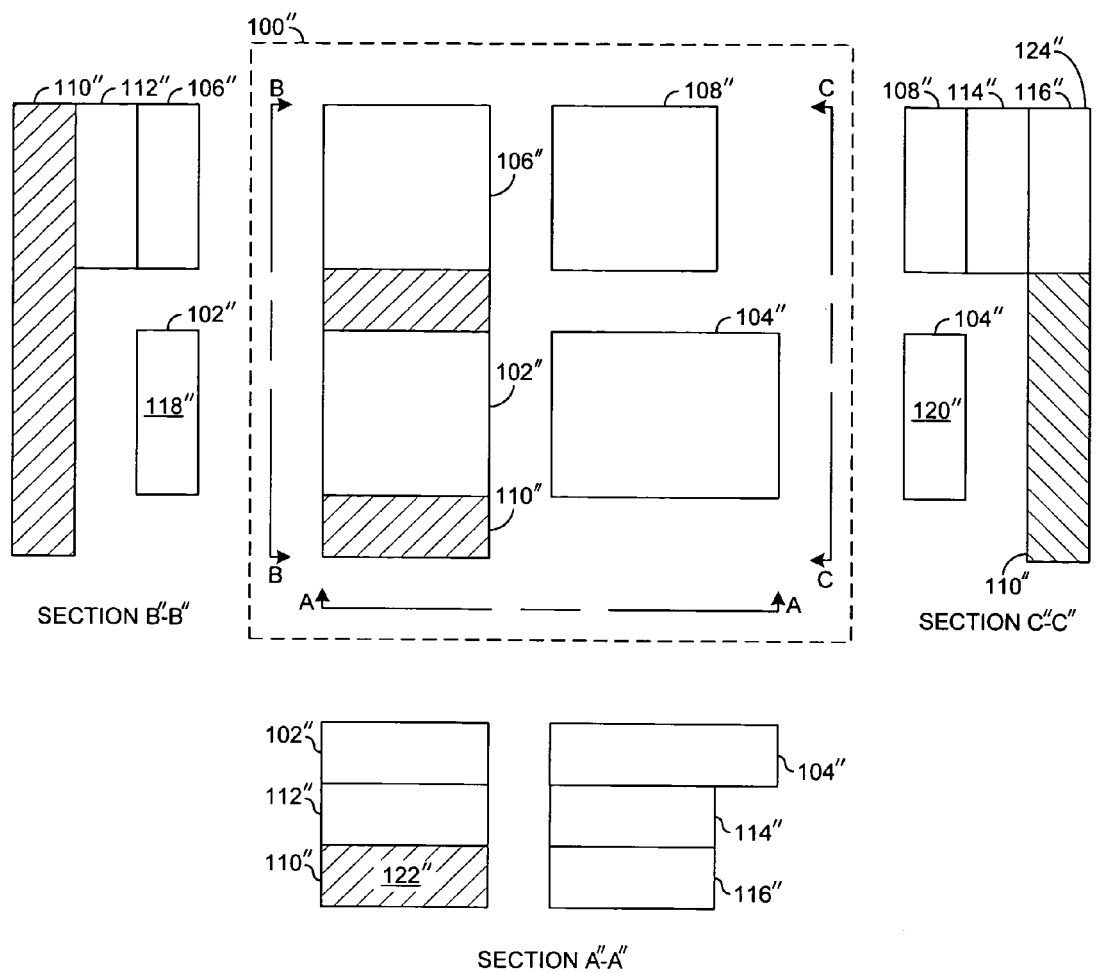
FIGS. 3(a–b) are diagrams illustrating various views of another set of array building blocks in accordance with a preferred embodiment of the present invention.

Referring to FIG. 3a, a block diagram is shown illustrating an A block 100" with vertical over horizontal configuration. The block 100" generally comprises a number of layers. In one example, the block 100" may be implemented with three layers. The block 100" generally comprises a number of metal portions arranged in the three layers. In one example, the block 100" comprises a metal portion 102", a metal portion 104", a metal portion 106", a metal portion 108", a metal portion 110", a metal portion 112", a metal portion 114", and a metal portion 116". While the block 100" is described as having a number of separate metal portions, one skilled in the art would understand that the various metal portions may be combined in a single metal structure. For example, the metal portions 106", 110" and 112" are generally connected together to form a single element or feature. Similarly, the metal portions 108", 114" and 116" are stacked together to form another element or feature.

Each of the metal portions 102", 104", 110" and 116" may be configured to connect the block 100" to other blocks. For example, the portion 102" generally has a surface (edge) 118" that may connect the block 100" horizontally to a second A block in a row. The portion 104" generally has a surface (or edge) 120" that may connect the block 100" horizontally to a third A block in the row. The portion 110" generally has a surface (or edge) 122" that may connect the block 100" vertically to a B block in a column. The portion 116" may have a surface (or edge) 124" that may connect the block 100 vertically to a second B block in the column. The interconnection of A and B blocks is illustrated in FIGS. 6a. and 11–14.

Various views (e.g., Sections A"—A", B"—B" and C"—C") are shown to more clearly illustrate the three-dimensional relationship of the metal portions of the block 100". The block 100" generally further comprises insulating portions which have been omitted for clarity. However, one of ordinary skill in the art would understand how and where to incorporate the insulating portions based on the position of the metal portions 102"–116".

Figure 3B:
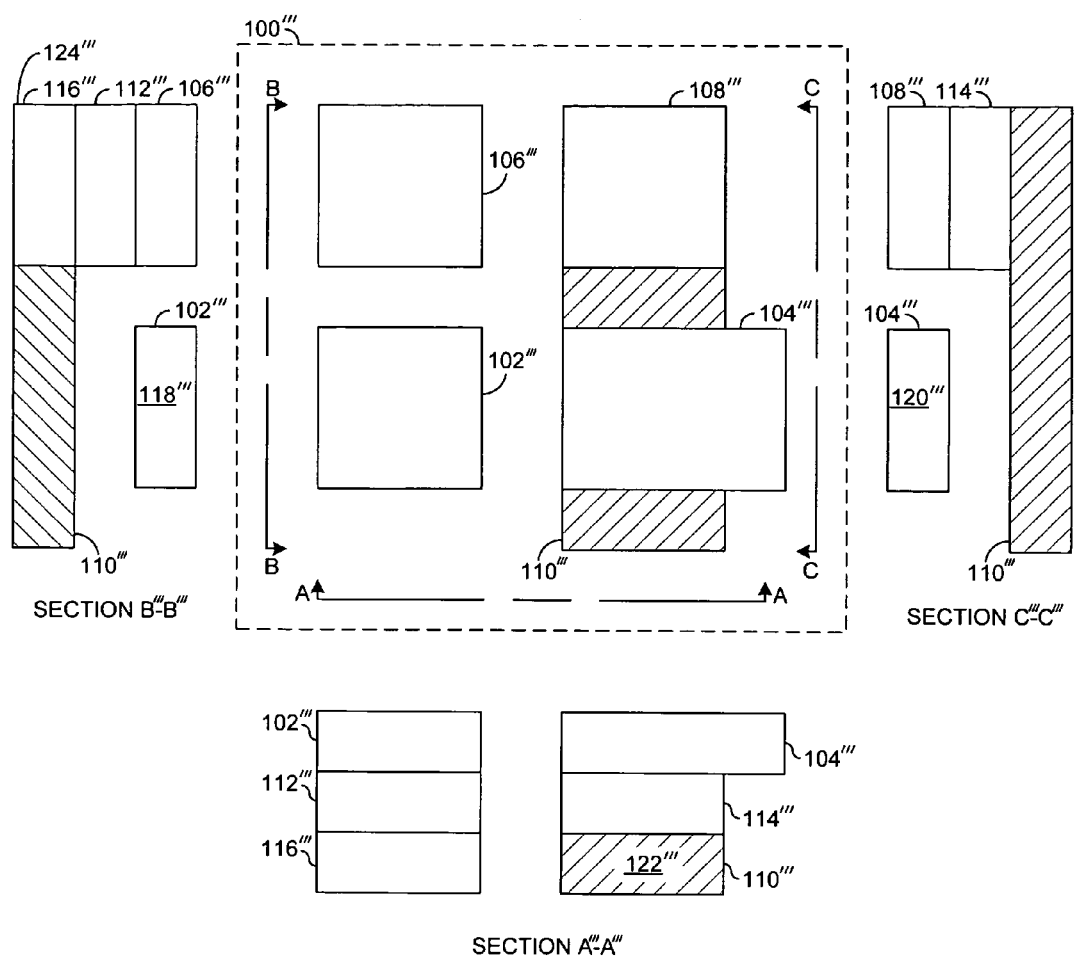

Referring to FIG. 3b, a block diagram is shown illustrating a B block 100''' with vertical over horizontal configuration. The block 100''' generally comprises a number of layers. In one example, the block 100''' may be implemented with three layers. The block 100''' generally comprises a number of metal portions arranged in the three layers. In one example, the block 100''' comprises a metal portion 102''', a metal portion 104''', a metal portion 106''', a metal portion 108''', a metal portion 110''', a metal portion 112''', a metal portion 114''', and a metal portion 116'''. While the block 100''' is described as having a number of separate metal portions, one skilled in the art would understand that the various metal portions may be combined in a single metal structure. For example, the metal portions 106''', 112''' and 116''' are generally connected together to form a single element or feature. Similarly, the metal portions 108''', 110''' and 114''' are stacked together to form another element or feature.

Each of the metal portions 102''', 104''', 110''' and 116''' may be configured to be connected the block 100''' to other blocks. For example, the portion 102''' generally has a surface (edge) 118''' that may connect the block 100''' horizontally to a second B block in a row. The portion 104''' generally has a surface (or edge) 120''' that may connect the block 100''' horizontally to a third B block in the row. The portion 110''' generally has a surface (or edge) 122''' that may connect the block 100''' vertically to an A block in a column. The portion 116''' may have a surface (or edge) 124''' that may connect the block 100''' vertically to a second A block in the column. The interconnection of A and B blocks is generally illustrated in FIGS. 6a. and 11–14.

Various views (e.g., Sections A'''—A''', B'''—B''' and C'''—C''') are shown to more clearly illustrate the three-dimensional relationship of the metal portions of the block 100'''. The block 100''' generally further comprises insulating portions which have been omitted for clarity. However, one of ordinary skill in the art would understand how and where to incorporate the insulating portions based on the positions of the metal portions 102'''—116'''.

Figure 4A:
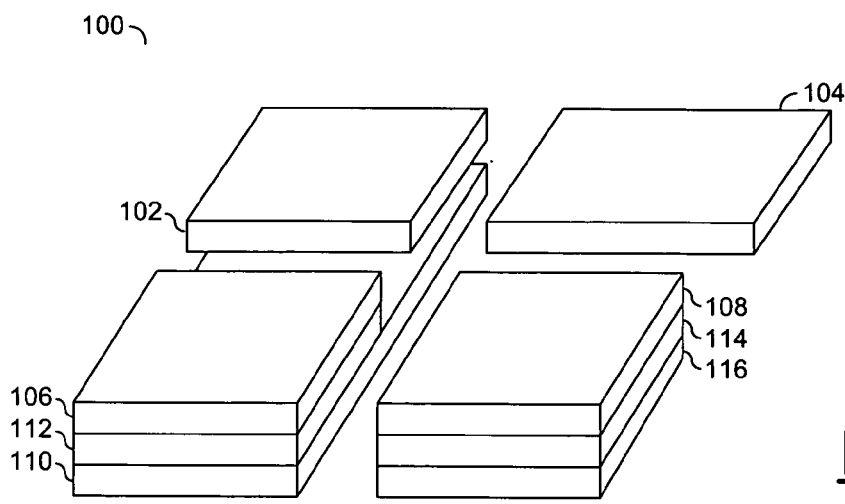
FIGS. 4(a–b) are orthogonal views of array building blocks of FIGS. 2(a–b)
Figure 4B:
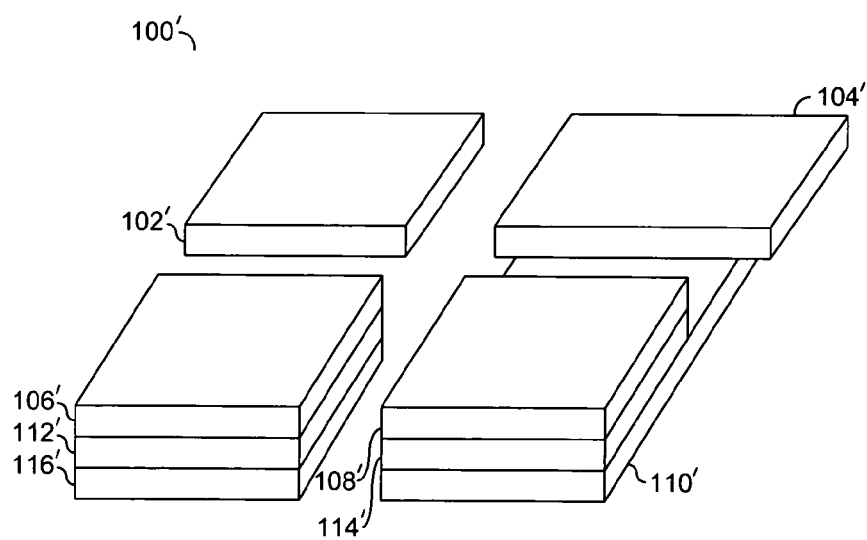

Referring to FIGS. 4(a–b), orthogonal diagrams are shown illustrating an A block of FIG. 2a (FIG. 4a) and a B block of FIG. 2b (FIG. 4b). Each of the blocks generally comprises three layers. Each of the blocks generally comprises four pads in the top layer that may be connected (e.g., by placement of one or more straps) to form various routes.

Figure 5A:
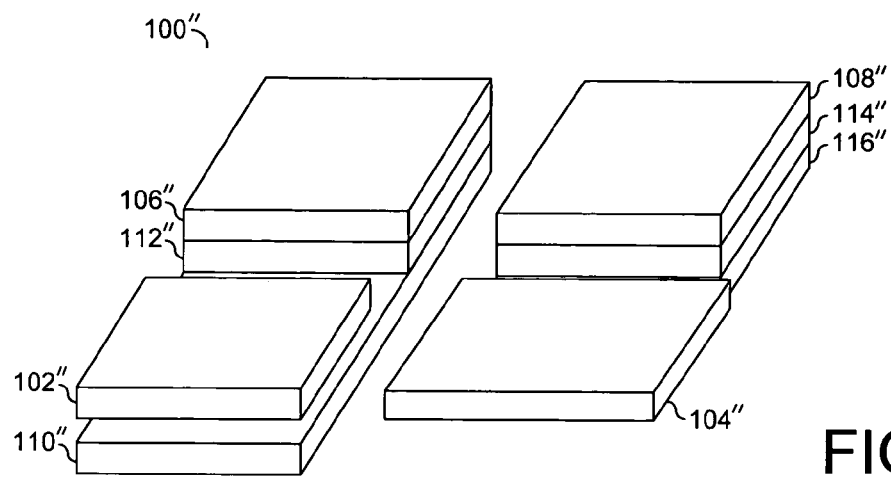
FIGS. 5(a–b) are orthogonal views of array building blocks of FIGS. 3(a–b); are diagrams illustrating a vertical row of blocks facilitating programming of vertical routes.
Figure 5B:
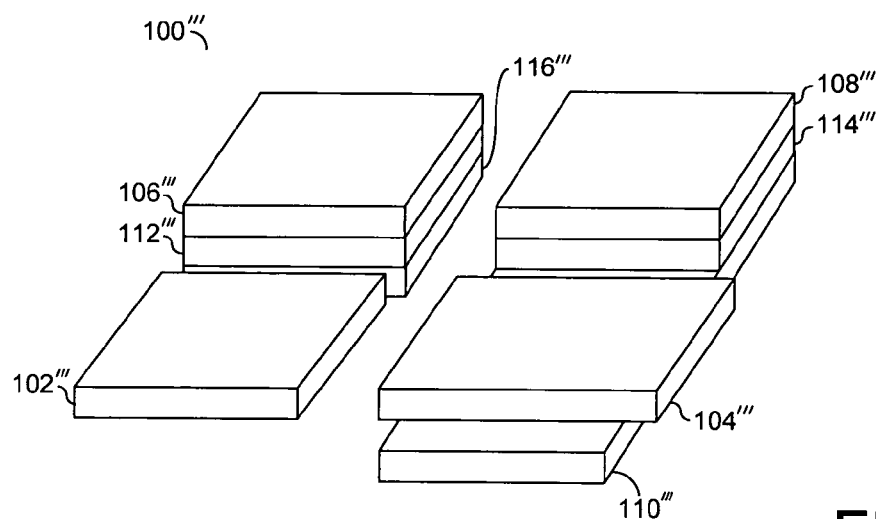

Referring to FIGS. 5(a–b), orthogonal diagrams are shown illustrating an A block of FIG. 3a (FIG. 5a) and a B block of FIG. 3b (FIG. 5b). Each of the blocks generally comprises three layers. Each of the blocks generally comprises four pads in the top layer that may be connected (e.g., by placement of one or more straps) to form various routes.

Referring to FIGS. 6(a–c), orthogonal diagrams illustrating a number of blocks configured to implement vertical and horizontal routes are shown. In general, vertical columns and horizontal rows of blocks may be may be implemented in the top layers of a semiconductor. In one example, the top three layers of the semiconductor may be used. For example, a number of blocks 100 may be connected to for a first horizontal row (e.g., ROW N) and a number of blocks 100' may be connected to form a second horizontal row (e.g., ROW N+1). The two rows may be connected together to form a programmable array. The programmable array generally has vertical columns comprising alternating blocks 100 and 100' (e.g., COLUMN N and COLUMN N+1). Although two rows and columns are illustrated, any number of rows and columns may be implemented accordingly to meet the design criteria of a particular application.

Figure 6B:
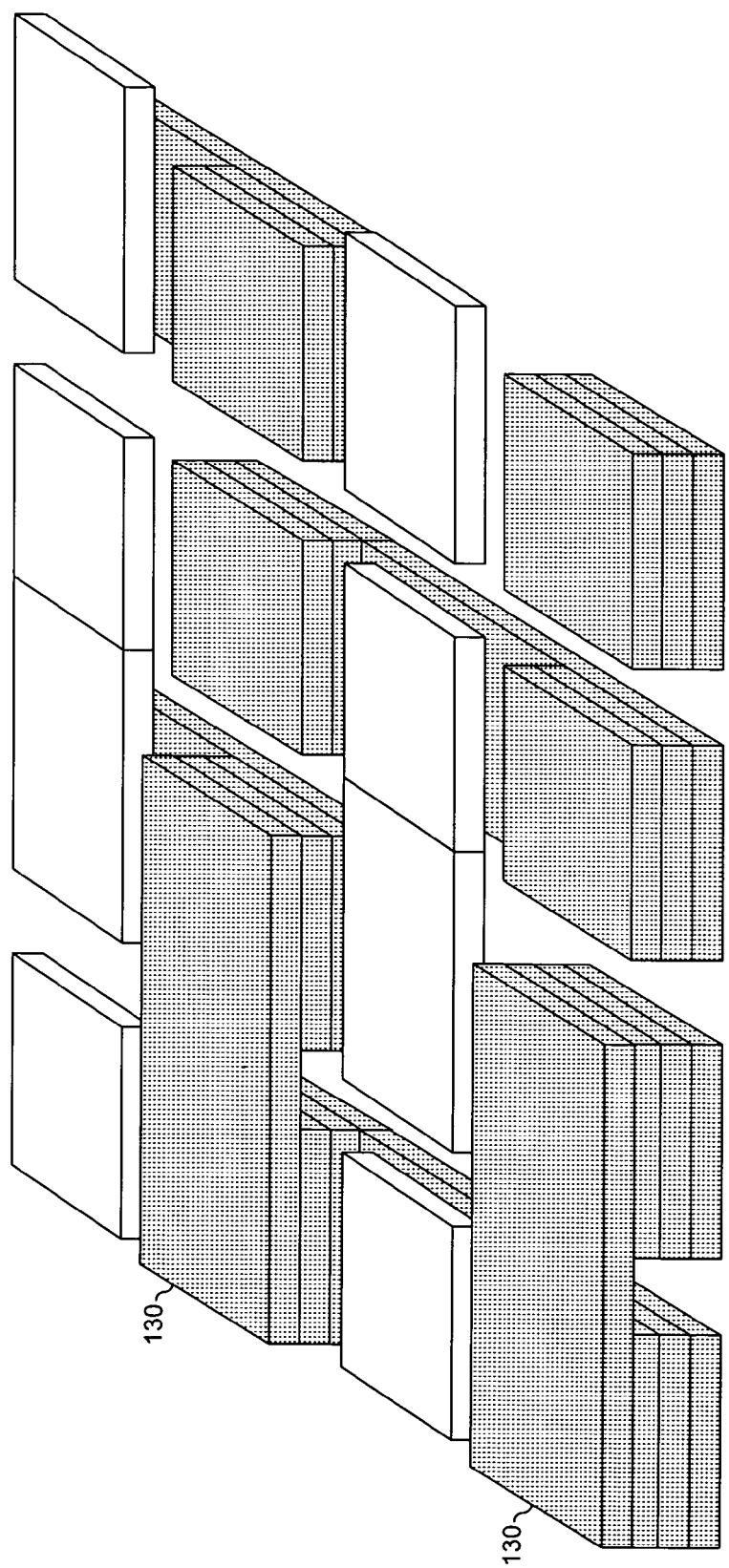
Figure 6C:
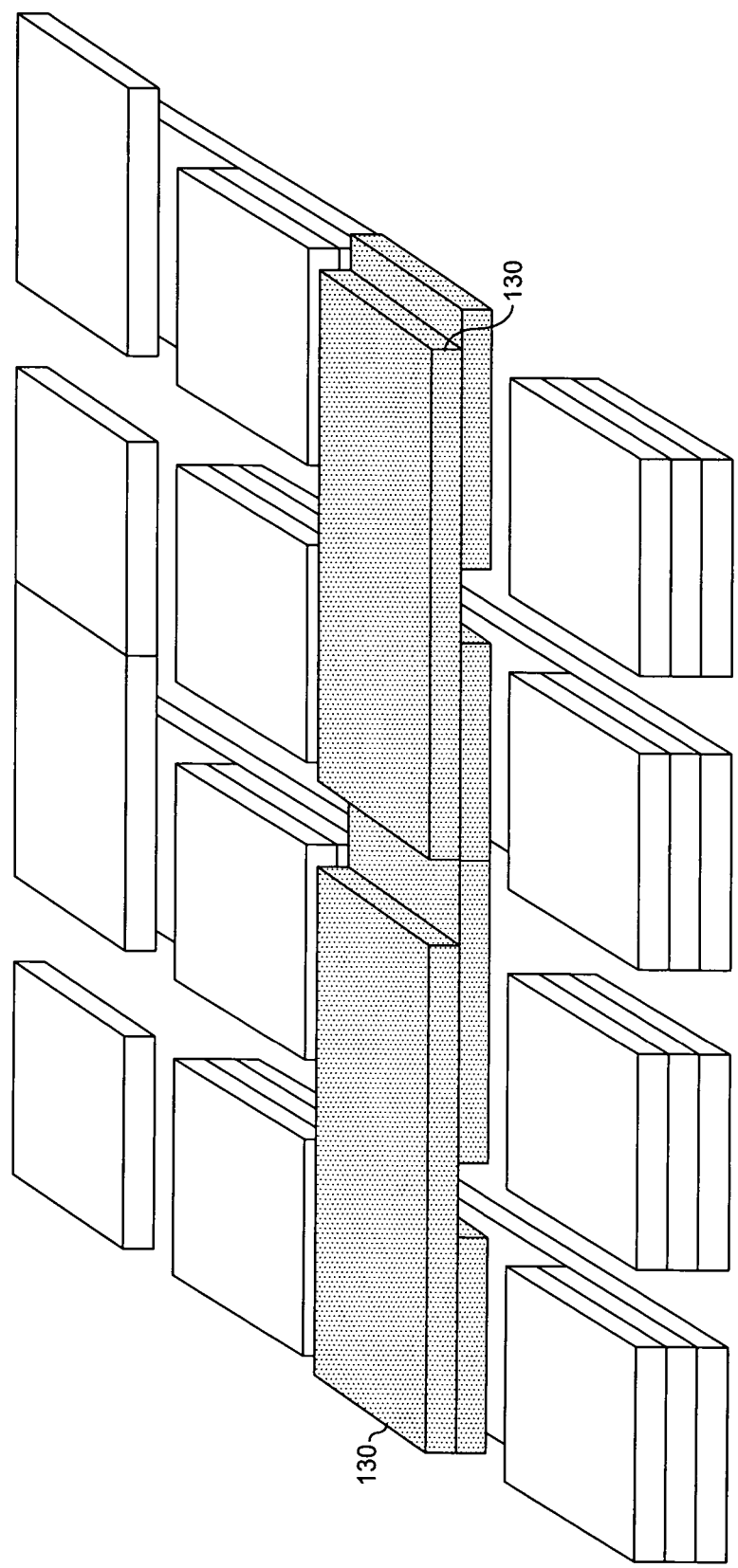

The programmable array may be configured (programmed), in one example, by placing a number of metal straps on the top layer of the array. The vertical columns and horizontal rows may be strapped together via horizontal straps 130 to provide vertical routes (FIG. 6*b*) and/or horizontal routes (FIG. 6*c*). The vertical routes generally weave through the layers of the vertical columns of blocks (FIG. 6*b*). The horizontal routes generally run along the top layer of the horizontal rows of blocks (FIG. 6*c*).

Figure 7:
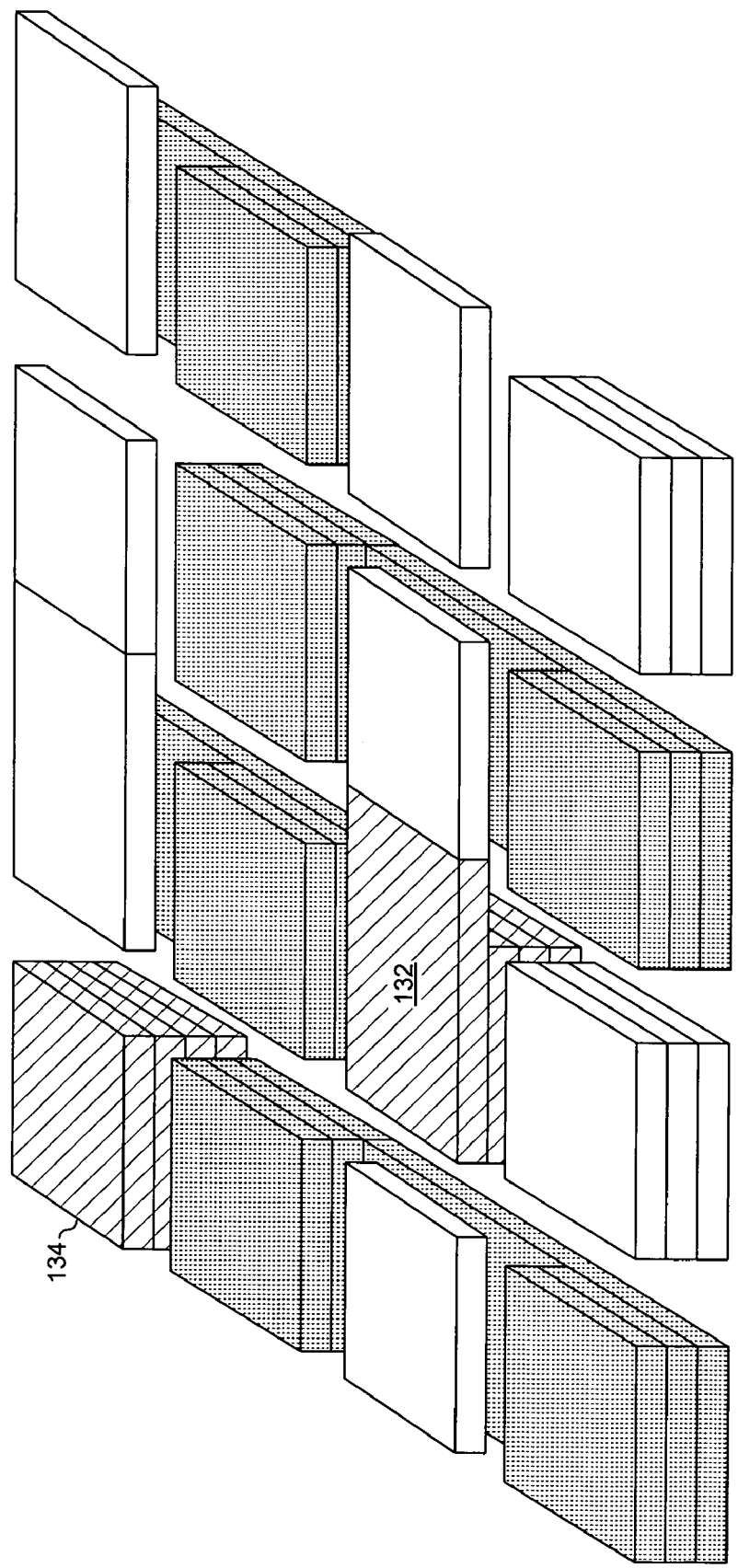
FIG. 7 is an orthogonal diagram illustrating an A block and a B block each configured to provide a contact to lower layers of a semiconductor in accordance with the preferred embodiment of the present invention.

Referring to FIG. 7, an orthogonal diagram is shown illustrating implementation of a contact 132 through the layers of an A block 100 and a contact 134 through the layers of a B block 100'. In general, each of the blocks 100 and 100' may be implemented with a pad in the top layer that may be connected to the bottom layer to form a contact with, for example, an active layer of the semiconductor or a lower wire layer. Contacts may be implemented similarly in the blocks 100" and 100'".

Referring to FIG. 8, block diagrams are shown illustrating a number of blocks connected (stacked) to form columns. In general, the two block types A and B may be stacked to form a column. In one example, the block types A and B may be configured as horizontal over vertical blocks (e.g., the blocks 100 and 100', respectively). Alternatively, the stacked A and B blocks may be configured as vertical over horizontal blocks (e.g., the blocks 100" and 100'", respectively). The A and B blocks in a column provide (i) vertical route segments that may be connected to form a vertical route along the column and (ii) horizontal route segments that may be connected as part of horizontal routes that cross the column.

Figure 9:
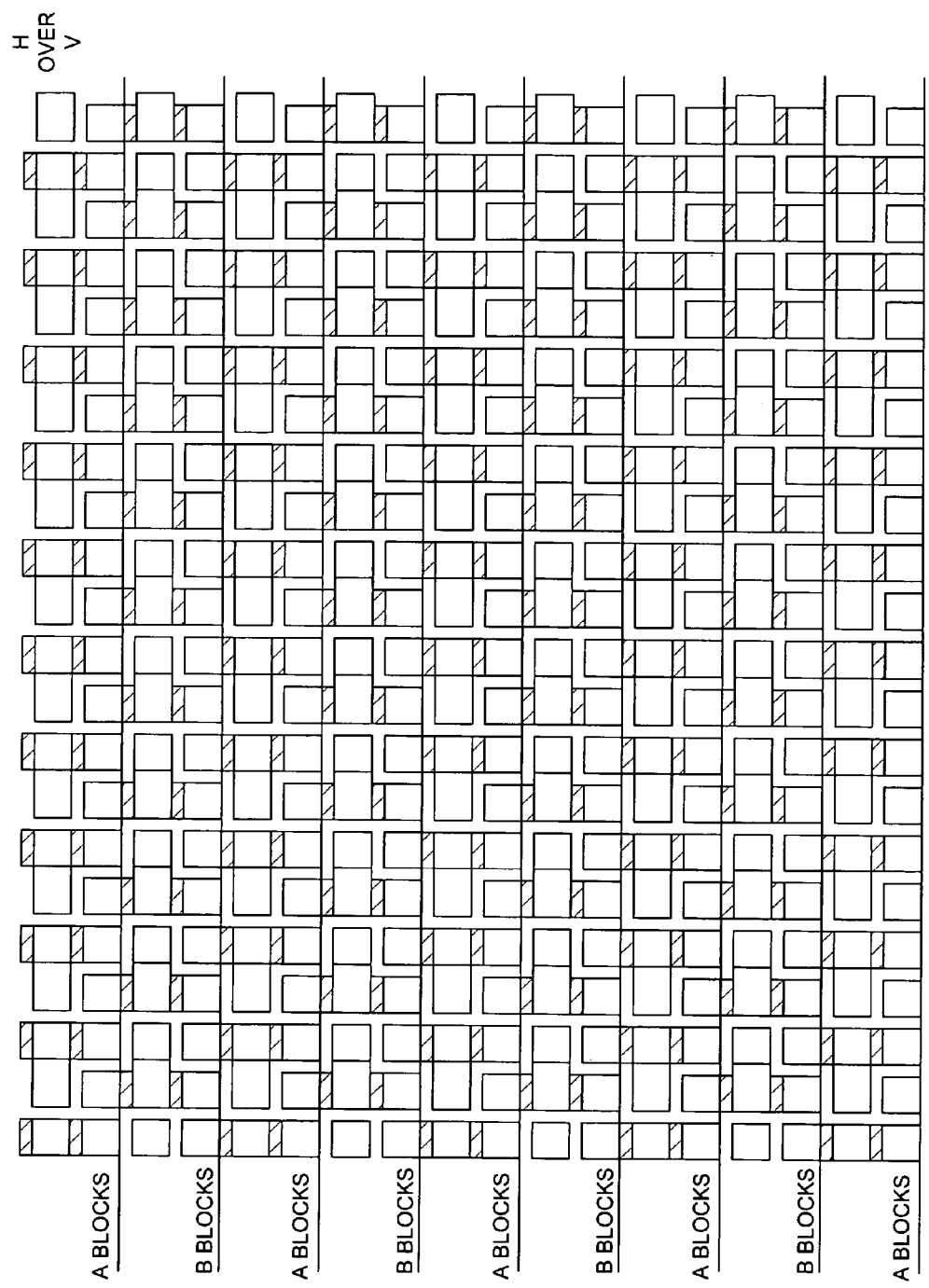
FIG. 9 is a block diagram illustrating an array comprising alternating rows of A and B blocks having a horizontal over vertical configuration.
Figure 10:
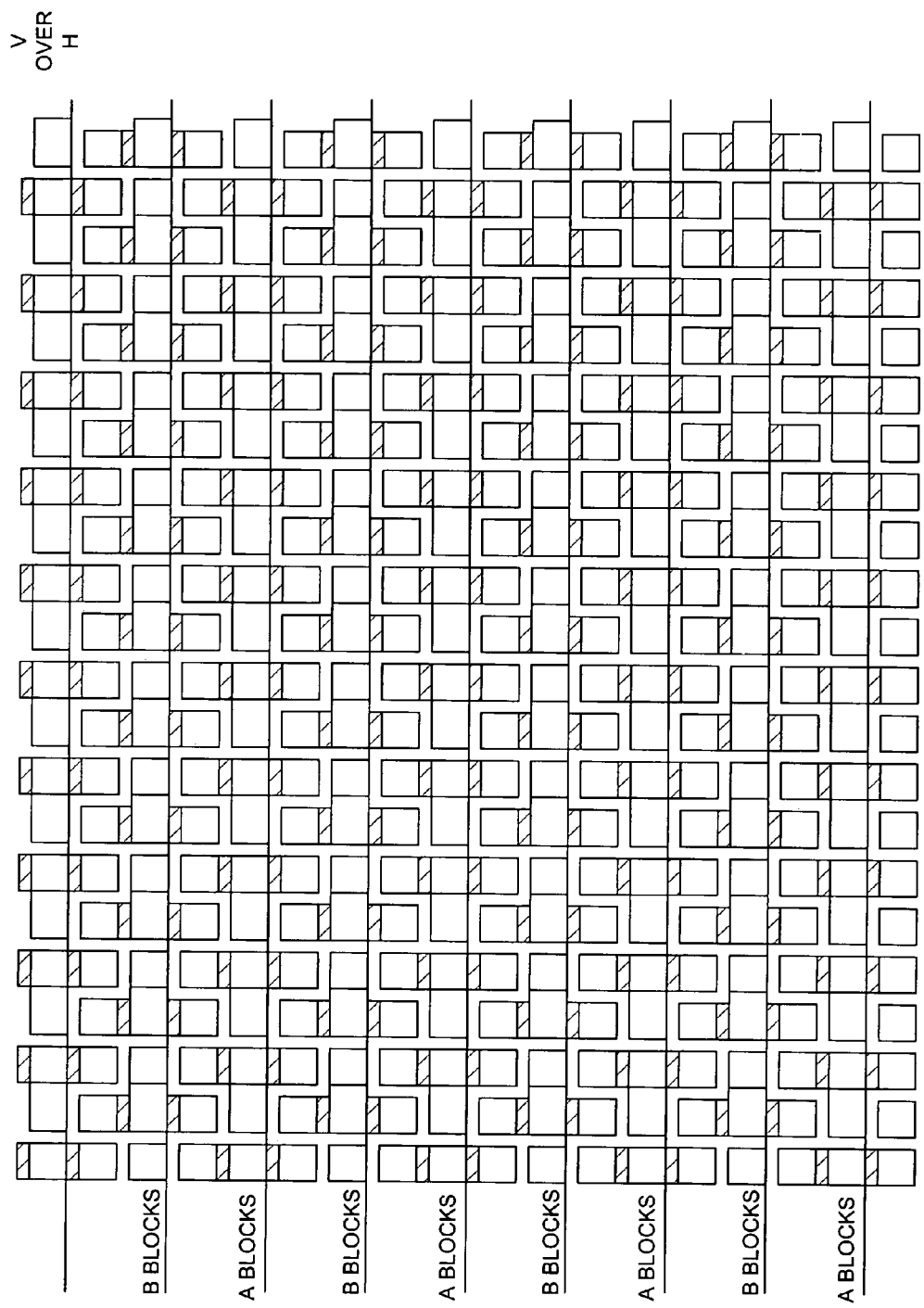
FIG. 10 is a block diagram illustrating an array comprising alternating rows of A and B blocks having a vertical over horizontal orientation.

Referring to FIGS. 9 and 10, block diagrams illustrating example programmable arrays in accordance with a preferred embodiment of the present invention are shown. In general, an array may be built of (i) alternating rows of A and B blocks (e.g., the blocks 100 and 100') having a horizontal over vertical configuration (FIG. 9) or (ii) alternating rows of A and B blocks (e.g., the blocks 100" and 100'") with a vertical over horizontal configuration (FIG. 10).

Figure 11:
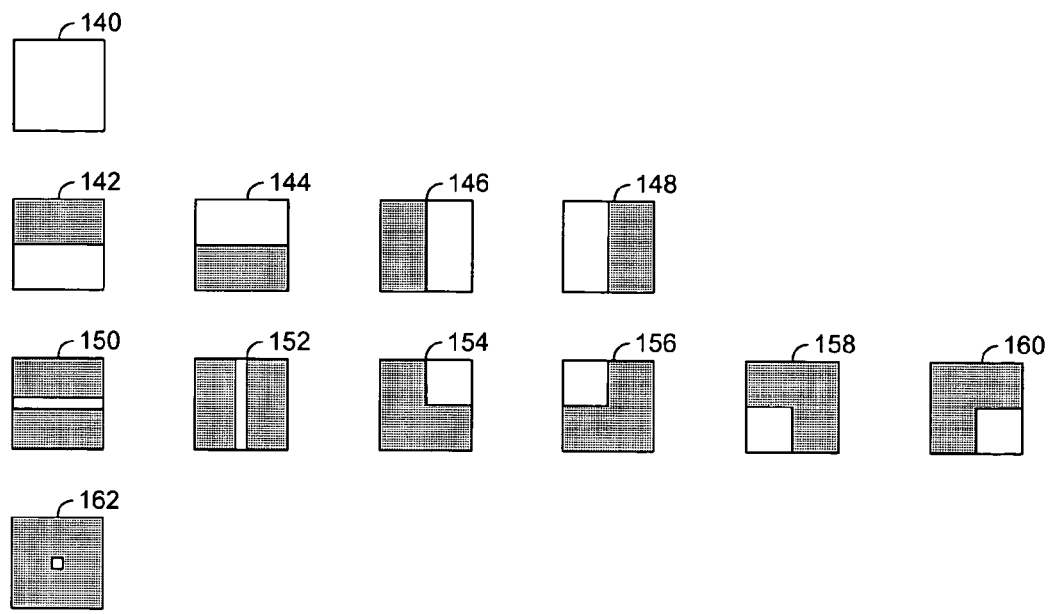
FIG. 11 is a block diagram illustrating various programming permutations of A blocks and B blocks in accordance with the preferred embodiment of the present invention.

Referring to FIG. 11, a block diagram is shown illustrating example programming permutations in accordance with a preferred embodiment of the present invention. In general, each 2×2 block (e.g., the blocks 100, 100', 100", and 100'") may be programmed using a 1×2 metal strap (portion). In general, a finite number of combinations for positioning the straps are possible. In one example, the number of combinations is 12. For example, a 2×2 block 140 may be programmed with no straps at all. Four programming permutations are generally possible that employ a single strap (e.g., the blocks 142, 144, 146 and 148). Six programming permutations are generally possible that employ two straps (e.g., the blocks 150–16). In general, a block 162 generally performs similarly regardless of whether the block 162 is programmed using three straps or four straps.

Figure 12:
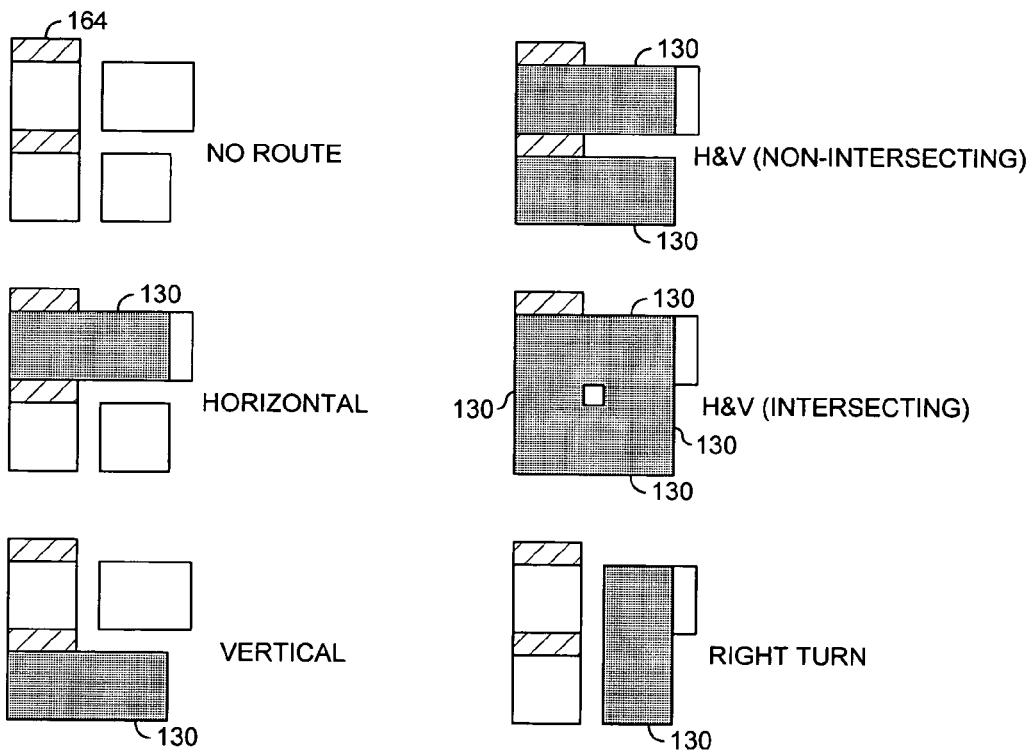
FIG. 12 is a more detailed block diagram illustrating various programming permutations yielding unique and useful routes.

Referring to FIG. 12, a block diagram is shown illustrating a number of routes that may be implemented via application of the programming permutations of FIG. 11 to an A type block. In general, a 2×2 A block 164 implemented similarly to the block 100 may be programmed using one or more 1×2 straps 130 to provide, for example, (i) no route, (ii) a horizontal route, (iii) a vertical route, (iv) a horizontal and vertical route that do not intersect, (v) horizontal and vertical routes that intersect and (vi) a route that makes a turn (e.g., a right turn). A 2×2 A block implemented similarly to the block 100" may provide similar programmable routing. A 2×2 B block implemented similarly to the block 100' or the block 100'" may provide similar programmable routing.

Figure 13:
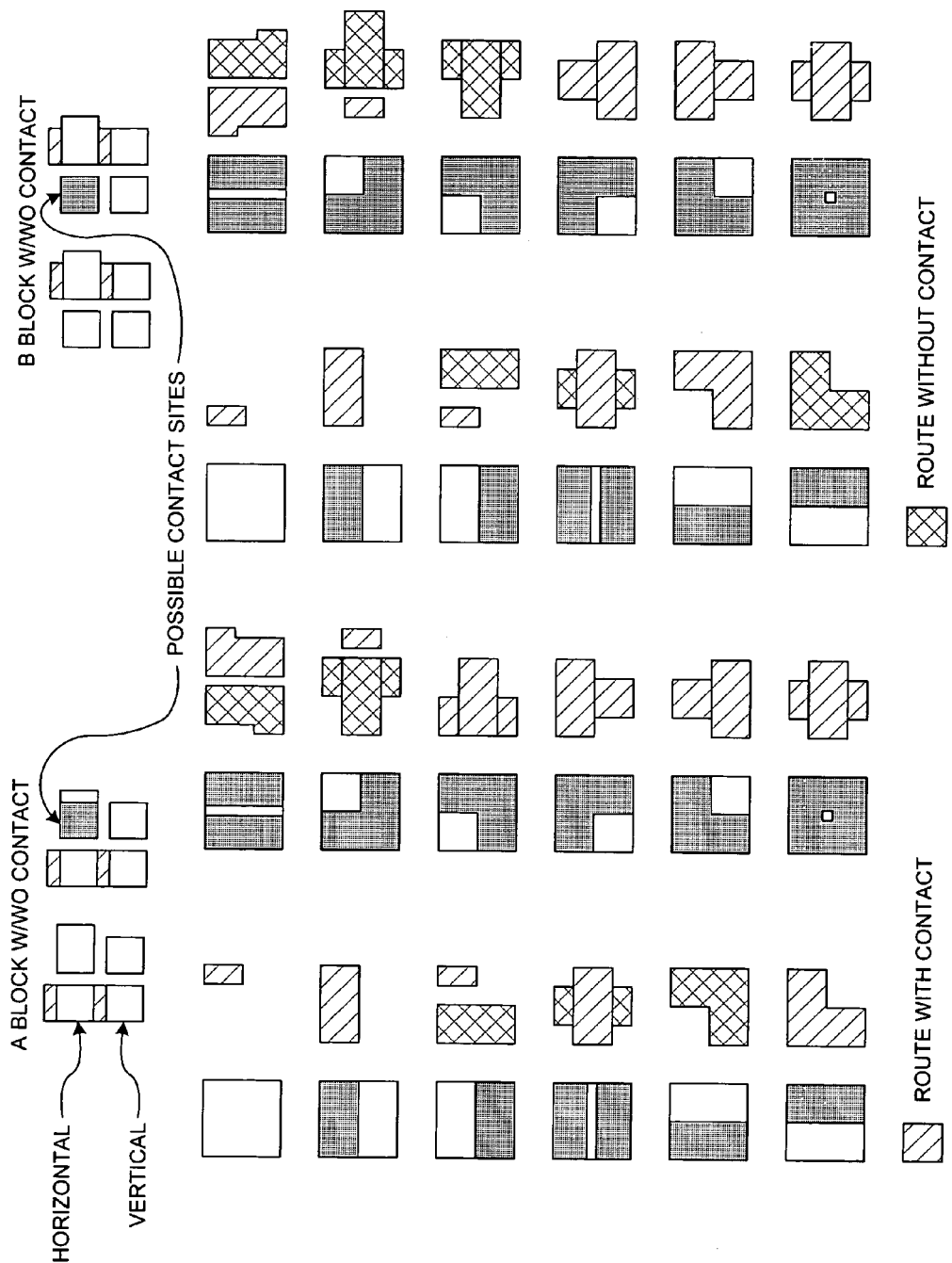
FIG. 13 is a block diagram illustrating route programming for both A and B blocks having a horizontal over vertical configuration.

Referring to FIG. 13, a block diagram is shown illustrating various example routes that may be programmed with A and B blocks having a horizontal over vertical configuration (e.g., the blocks 100 and 100'). Routes are generally illustrated for A blocks and B blocks implemented with and without contacts to lower levels.

Figure 14:
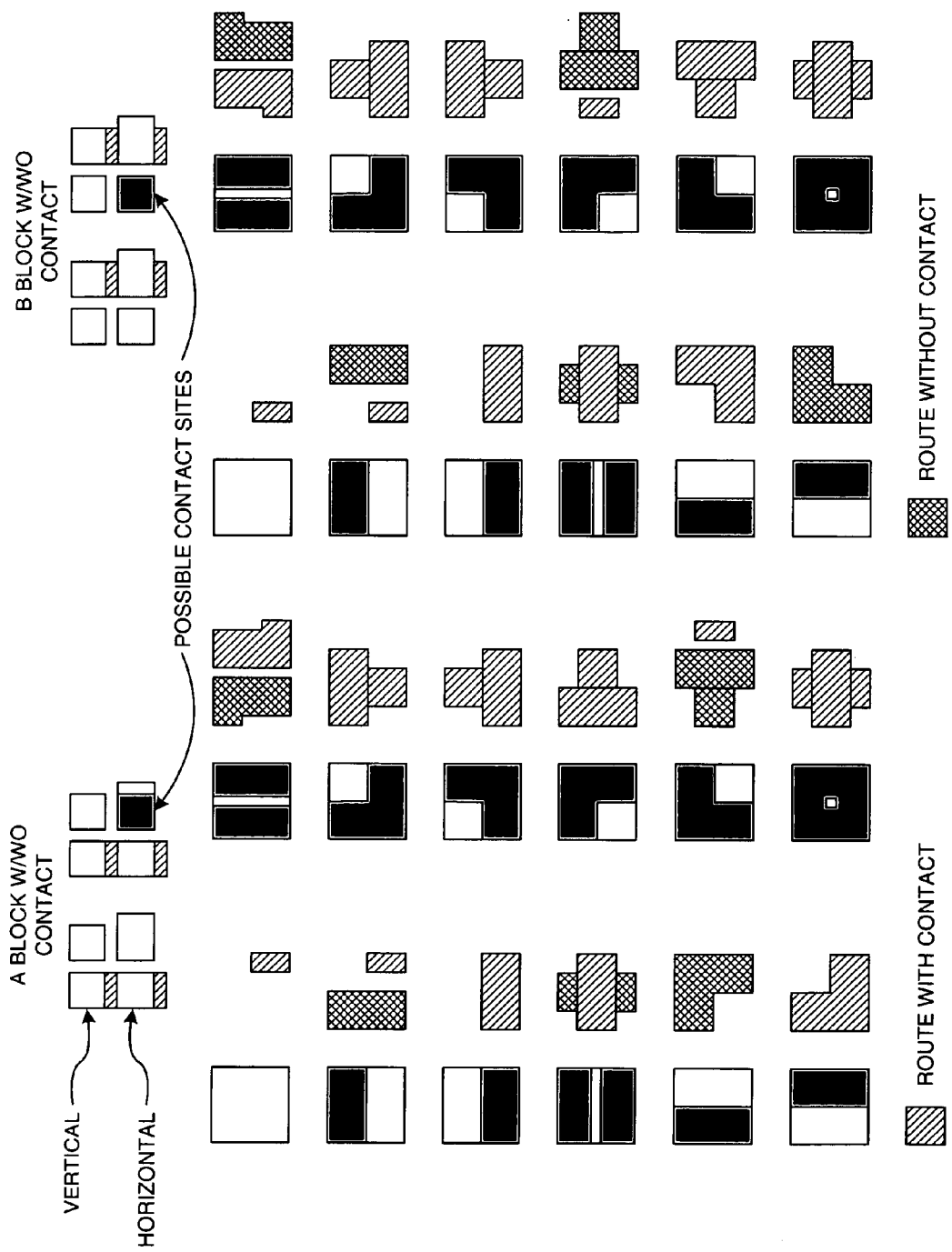
FIG. 14 is a block diagram illustrating route programming in A and B blocks having a vertical over horizontal configuration.

Referring to FIG. 14, a block diagram is shown illustrating various example routes that may be programmed with A and B blocks having a vertical over horizontal configuration (e.g., the blocks 100" and 100'"). Routes are generally illustrated for A blocks and B blocks implemented with and without contacts to lower levels.

Figure 15:
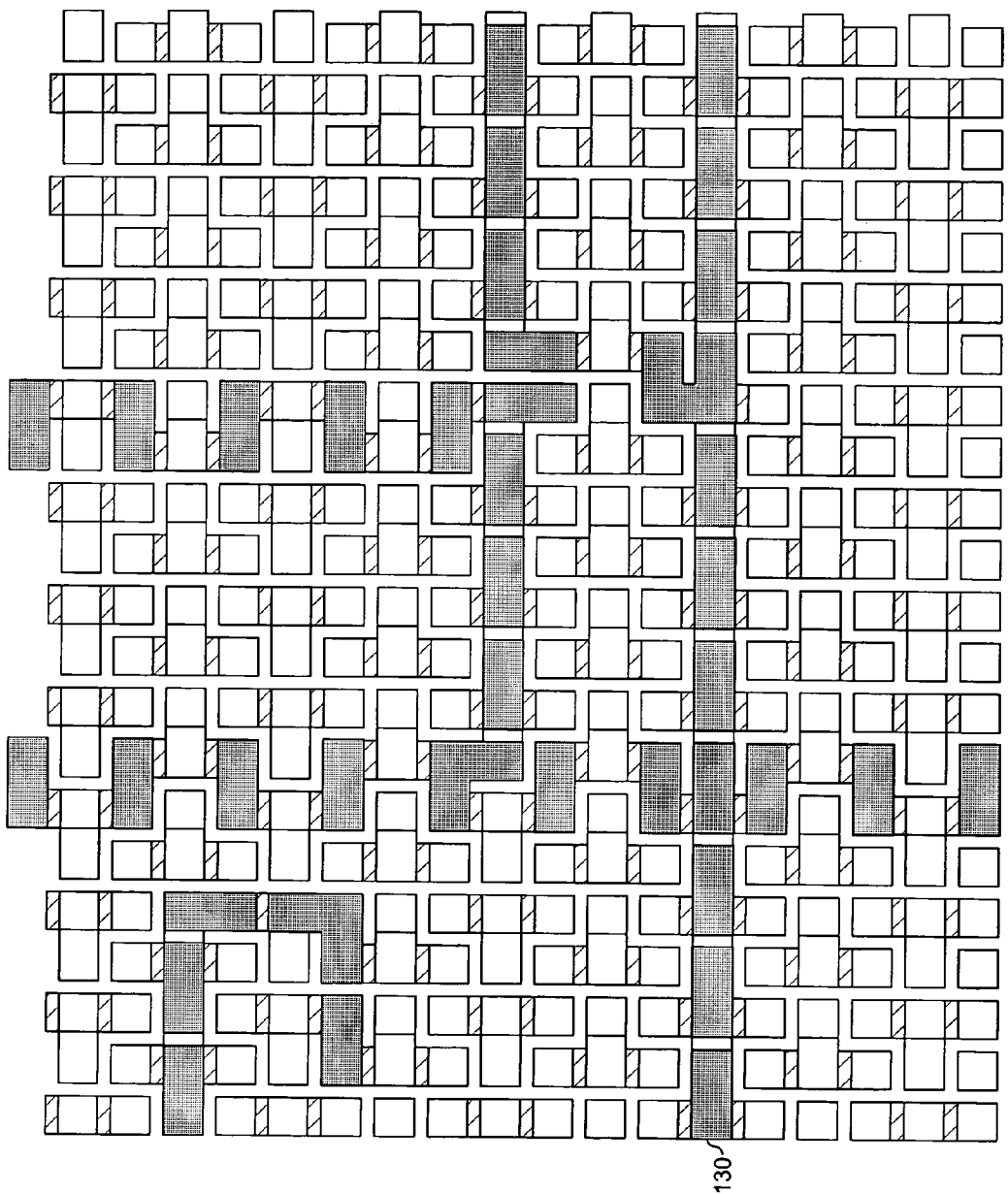
FIG. 15 is a block diagram illustrating an example programming of an array in accordance with a preferred embodiment of the present invention.
Figure 16:
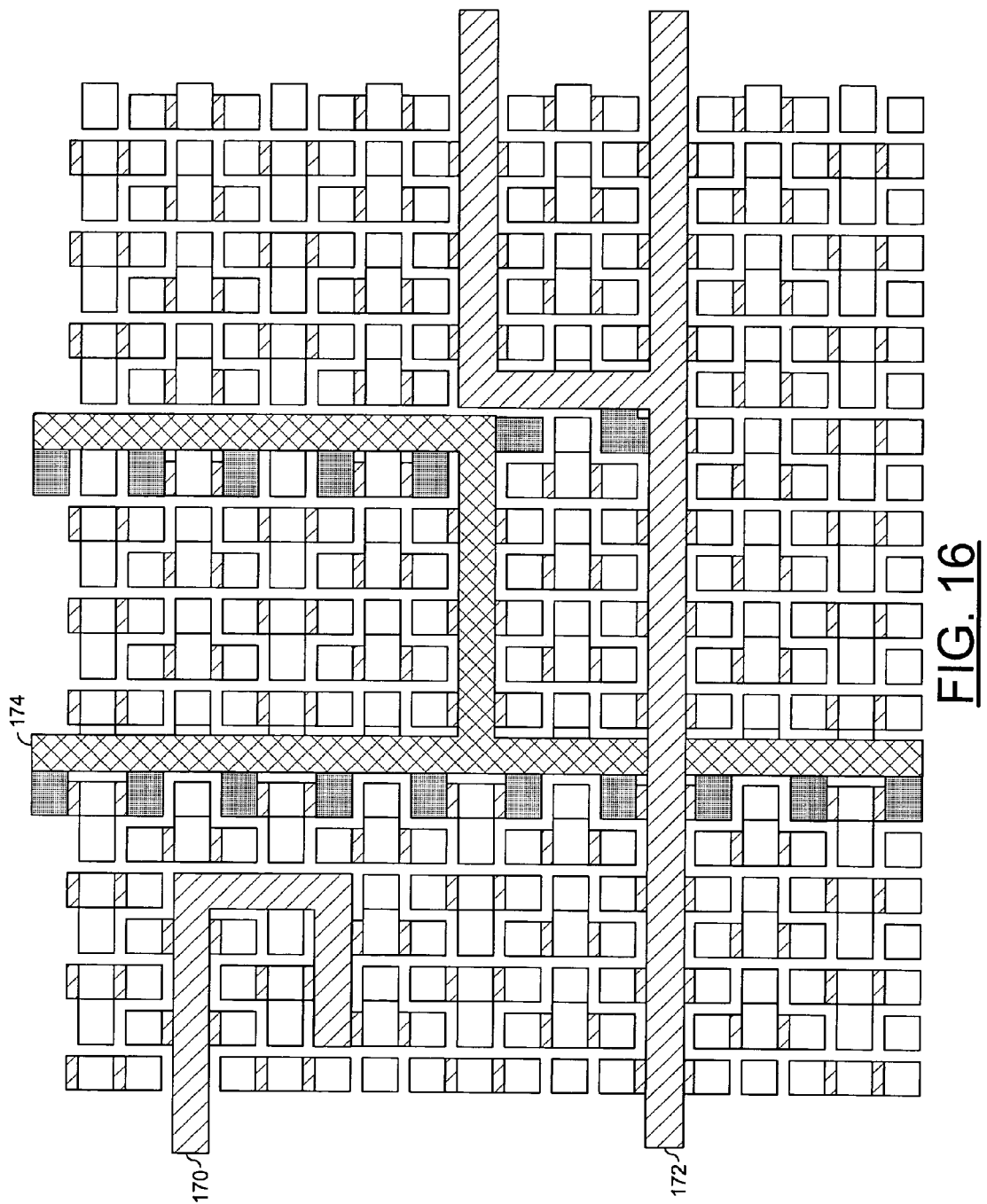
FIG. 16 is a block diagram illustrating example routes formed by the programmed blocks in the array of FIG. 15.

Referring to FIG. 15, a diagram is shown illustrating an example array of 2×2 blocks (e.g., blocks 100 and 100') programmed in accordance with a preferred embodiment of the present invention. In one example, a number of straps 130 may be place on the top layer of an array of blocks to form a number of routes. Although all of the straps are placed in a single layer, the routes may cross one another without touching. Referring to FIG. 16, a diagram is shown highlighting a route 170, a route 172 and a route 174 formed by the placement of the programming straps 130 of FIG. 15. The programmed route lengths illustrated (e.g., both horizontal and vertical) are generally equivalent to Manhattan lengths. An array comprising 2×2 blocks implemented similarly to the blocks 100" and 100'" may be programmed similarly.

Figure 17:
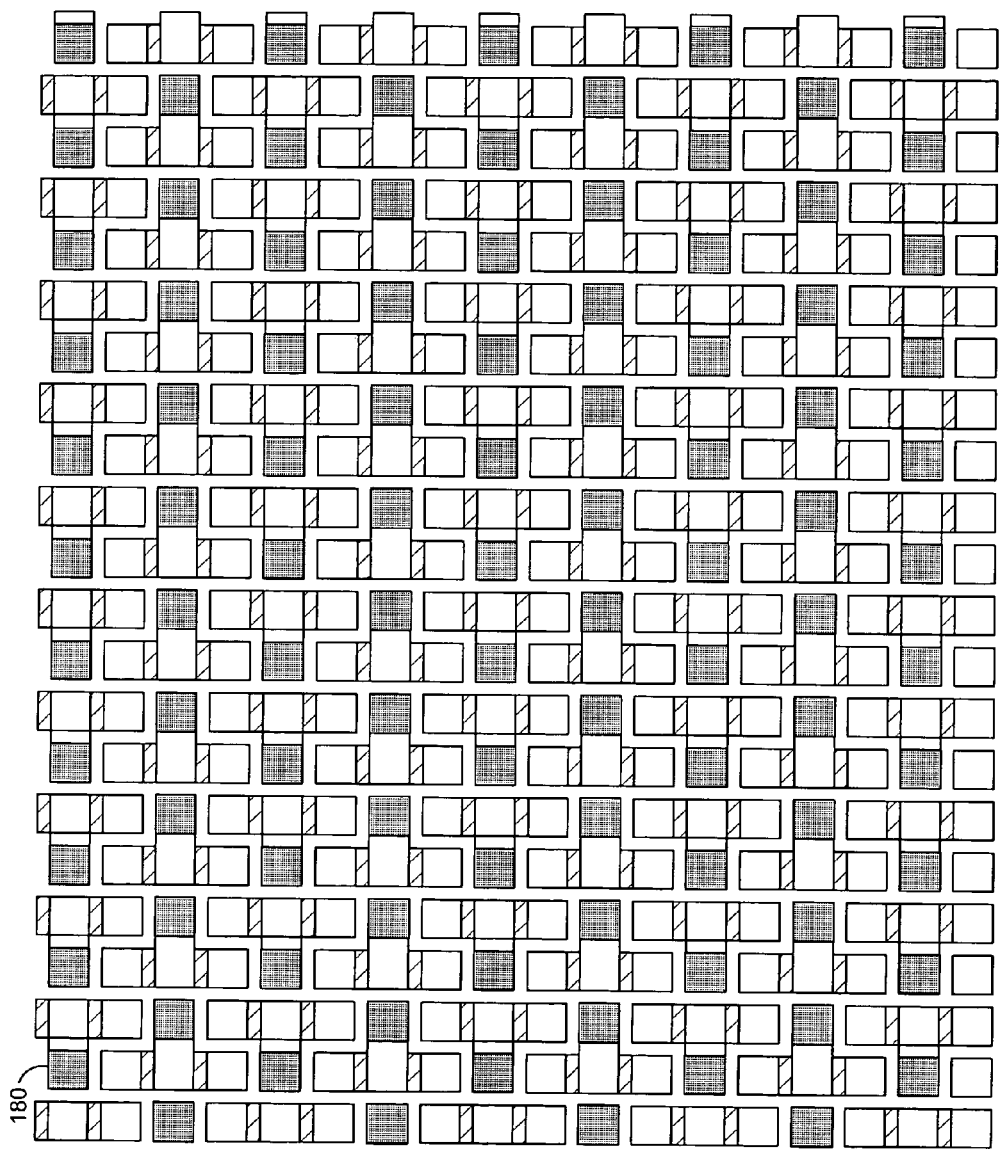
FIG. 17 is a block diagram illustrating an example of available contact points provided by an array in accordance with a preferred embodiment of the present invention.

Referring to FIG. 17, a block diagram is shown illustrating available contact positions in an array of 2×2 blocks implemented in accordance with a preferred embodiment of the present invention. The array may provide contact positions 180 to lower layers with a contact ratio of up to one to four contacts. In general, the populated contacts are determined by lower layers of the semiconductor rather than the programmable grid (array). A similar number of contacts are available in an array comprising 2×2 blocks implemented similarly to the blocks 100" and 100'".

Figure 18:
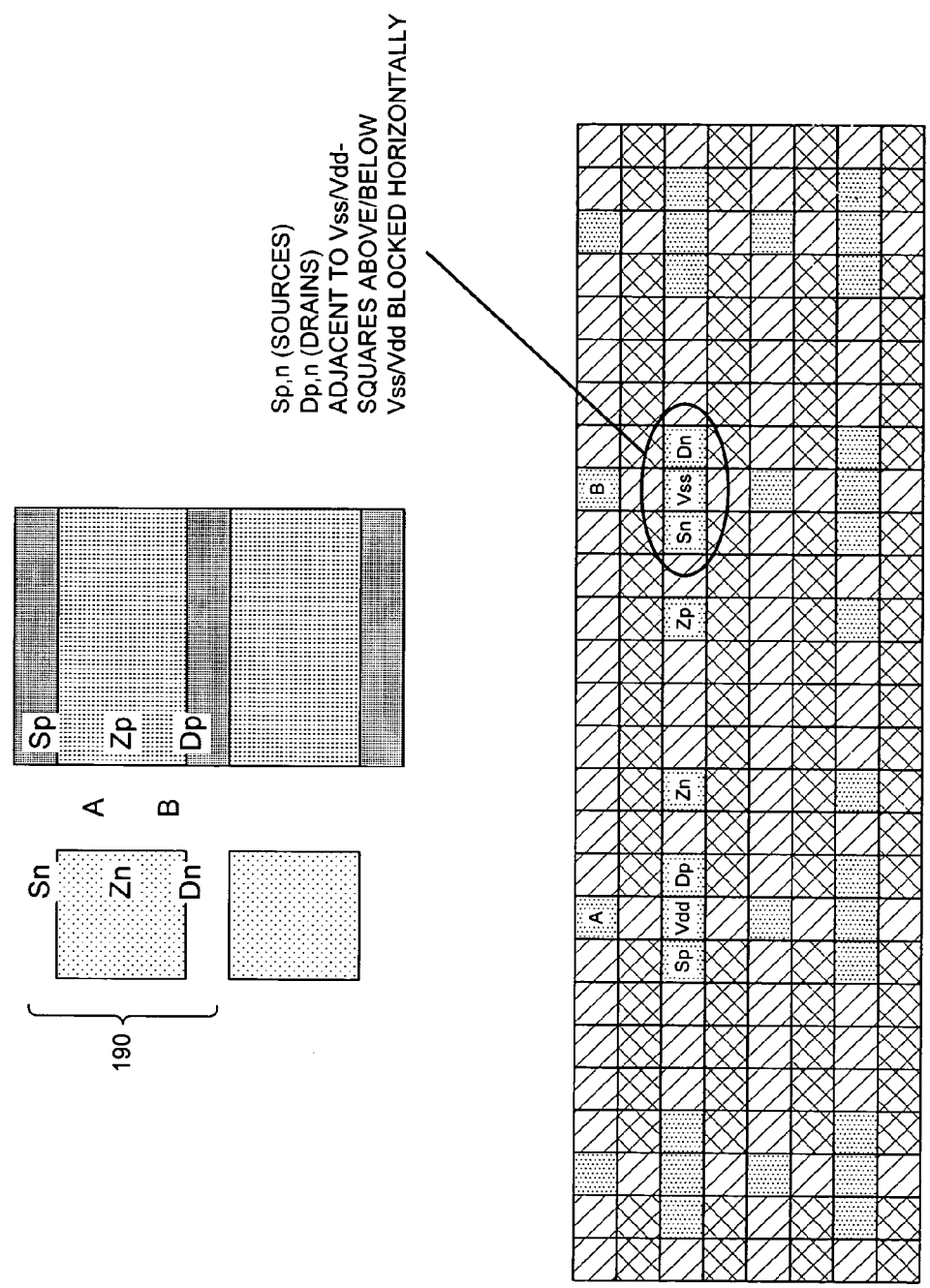
FIG. 18 is a block diagram illustrating an R-cell implemented in lower layers of a semiconductor and a programming array in accordance with a preferred embodiment of the present invention for personalizing the R-cell.

Referring to FIG. 18, a diagram is shown illustrating an R-cell 190 and a programmable metal grid in accordance with the present invention. In one example, a region of the semiconductor device may be implemented with a number of R-cells. As used herein, R-cells generally refer to an area of silicon designed (or diffused) to contain one or more transistors or gates that have not yet been personalized (or configured) with metal layers. Wire layers may be added to the R-cells to make particular transistors, logic gates and/or storage elements. An R-cell generally comprises one or more diffusions for forming the parts of transistors and/or gates and the contact points where wires may be attached in subsequent manufacturing steps (e.g., to power, ground, inputs and outputs). For example, the contact points of the R-cells may be connected to a programmable metal grid in accordance with the present invention to facilitate configuration of the R-cells by placement of straps on the top surface of the semiconductor device.

In general, the R-cells may be, in one example, building blocks for logic and/or storage elements. For example, one way of designing a chip that performs logic and storage functions may be to lay down numerous R-cells row after row, column after column. A large area of the chip may be devoted to nothing but R-cells. The R-cells may be personalized (or configured) in subsequent production steps (e.g., by depositing metal layers) to provide particular logic functions. The logic functions may be further wired together (e.g., a gate array design).

In one example, an 11×4 programmable array (or grid) of 2×2 blocks may be implemented for (e.g., over) each R-cell 190. A number of contacts in the programmable grid may be preassigned to facilitate configuration of the R-cell 190. For example, contacts for sources and drains may be assigned adjacent to supply contacts (e.g., Sp and Dp may be adjacent to VDD and Sn and Dn may be adjacent to VSS). In one example, grid locations above and below the supply contacts may be blocked horizontally.

Referring to FIG. 19, a diagram is shown illustrating a programming example using the R-cell 190 and grid of FIG. 18. In one example, the R-cell 190 may be configured as a 2-input NAND gate by programming (e.g., placing straps on) the preassigned contacts in the grid over the R-cell 190.

Referring to FIG. 20, a diagram is shown illustrating another programming example using the R-cell and grid of FIG. 18. In another example, a 4-input NAND gate may be implemented by configuring the R-cell 190 and a second R-cell 192 via appropriate straps placed on the programming grid associated with the R-cells.

While the invention has been particularly shown and described with reference to the preferred embodiments thereof, it will be understood by those skilled in the art that various changes in form and details may be made without departing from the spirit and scope of the invention.

The invention claimed is:

1. A semiconductor comprising:
a plurality of first building blocks arranged in one or more first rows, each of said first building blocks having a first layer, a second layer and a third layer, said first layer having a first metal portion and a second metal portion, said first metal portion being larger than said second metal portion; and
a plurality of second building blocks arranged in one or more second rows, each of said second building blocks having a first layer, a second layer and a third layer, said first layer of said second building blocks having a first metal portion and a second metal portion, said first metal portion being larger than said second metal portion, wherein (i) said first metal portion and said second metal portion in said first layer of said second building blocks are arranged complementary to said first metal portion and said second metal portion in said first layer of said first building blocks, (ii) said one or more second rows are interleaved with said one or more first rows and (iii) said first building blocks and said second building blocks each provide a single segment of horizontal routing and a single segment of vertical routing.

2. The semiconductor according to claim 1, wherein horizontal and vertical routes of said semiconductor are programmable via one or more metal straps placed in a single layer on top of said first building blocks and said second building blocks.

3. The semiconductor according to claim 1, wherein:
said third layer of each of said first building blocks and each of said second building blocks includes a third metal portion, a fourth metal portion, a fifth metal portion, and a sixth metal portion; and
said second layer of each of said first building blocks and each of said second building blocks includes a seventh metal portion and an eighth metal portion, wherein (i) said first metal portion in said first building blocks is connected to said third metal portion by said seventh metal portion, (ii) said second metal portion in said first building blocks is connected to said fourth metal portion by said eighth metal portion, (iii) said first metal portion in said second building blocks is connected to said fourth metal portion by said eighth metal portion and (iv) said second metal portion in said second building blocks is connected to said third metal portion by said seventh metal portion.

4. The semiconductor according to claim 1, wherein said first metal portion of each of said first building blocks is connected to said second metal portion of an adjacent one of said second building blocks.

5. The semiconductor according to claim 1, wherein said first metal portion of each of said second building blocks is connected to said second metal portion of an adjacent one of said first building blocks.

6. The semiconductor according to claim 3, wherein:
two or more of said third metal portion, said fourth metal portion, said fifth metal portion, and said sixth metal portion in each of said first and said second building blocks are connected with a metal strap to program routing connections using a top layer of said semiconductor.

7. The semiconductor according to claim 3, wherein:
one of said fifth and said sixth metal portions is connected to a lower layer of said semiconductor.

8. The semiconductor according to claim 3, wherein said fifth metal portion of one of said first or said second building blocks is connected to said sixth metal portion of an adjacent one of said first or said second building blocks in the same row.

9. The semiconductor according to claim 1, wherein said first metal portion of one of said first or second building blocks in a first row is connected to said second metal portion of one of said second or first building blocks, respectively, in a second row.

10. The semiconductor according to claim 1, wherein each of said first building blocks and said second building blocks can be customized as (i) a horizontal segment of routing in a first mode, (ii) a vertical segment of routing in a second mode, (iii) a horizontal segment and a vertical segment of routing that do not intersect, (iv) a horizontal segment and a vertical segment of routing that intersect and (v) a segment of routing that changes from horizontal to vertical.

11. The semiconductor according to claim 1, wherein said first building blocks and said second building blocks have a horizontal over vertical arrangement.

12. The semiconductor according to claim 1, wherein said first building blocks and said second building blocks have a vertical over horizontal arrangement.

13. The semiconductor according to claim 1, wherein said first building blocks and said second building blocks are fabricated as top layers of said semiconductor.

14. The semiconductor according to claim 1, wherein said first building blocks and said second building blocks are customized with a single mask layer.

15. The semiconductor according to claim 1, wherein said first building blocks and said second building blocks are customized using a direct electron beam write.

16. The semiconductor according to claim 1, wherein said first building blocks and said second building blocks comprise the smallest metal features of said semiconductor.

17. The semiconductor according to claim 1, wherein each wire in said semiconductor weaves up and down through layers of the semiconductor such that each wire is available in the top layer for programming.

18. The semiconductor according to claim 1, wherein said first building blocks and said second building blocks are connected to form a programmable array.

19. A semiconductor comprising:
means for programming one or more first vertical segments and one or more first horizontal segments arranged in one or more first rows; and
means for programming one or more second vertical segments and one or more second horizontal segments arranged in one or more second rows, wherein (i) a first layer of each of said means for programming one or more first vertical segments and one or more first horizontal segments and said means for programming one or more second vertical segments and one or more second horizontal segments has a first metal portion and a second metal portion, said first metal portions being larger than said second metal portions, (ii) said first metal portion and said second metal portion of said means for programming one or more second vertical segments and one or more second horizontal segments are arranged complementary to said first metal portion and said second metal portion of said first layer of said means for programming one or more first vertical segments and one or more first horizontal segments, and (iii) said one or more second rows are interleaved with said one or more first rows.

* * * * *